(12) United States Patent
Na

(10) Patent No.: US 11,610,932 B2
(45) Date of Patent: Mar. 21, 2023

(54) PHOTODETECTING DEVICE WITH ENHANCED COLLECTION EFFICIENCY

(71) Applicant: ARTILUX, INC., Menlo Park, CA (US)

(72) Inventor: Yun-Chung Na, Menlo Park, CA (US)

(73) Assignee: ARTILUX, INC., Menlo Park, CA (US)

( * ) Notice: Subject to any disclaimer, the term of this patent is extended or adjusted under 35 U.S.C. 154(b) by 627 days.

(21) Appl. No.: 16/716,114

(22) Filed: Dec. 16, 2019

(65) Prior Publication Data

US 2020/0194486 A1 Jun. 18, 2020

Related U.S. Application Data

(60) Provisional application No. 62/786,389, filed on Dec. 29, 2018, provisional application No. 62/780,337, filed on Dec. 17, 2018.

(51) Int. Cl.
*H01L 27/146* (2006.01)
*H01L 31/113* (2006.01)
*H04B 10/69* (2013.01)

(52) U.S. Cl.
CPC ...... *H01L 27/14643* (2013.01); *H01L 31/113* (2013.01); *H04B 10/691* (2013.01)

(58) Field of Classification Search
None
See application file for complete search history.

(56) References Cited

U.S. PATENT DOCUMENTS

| 10,418,407 | B2 * | 9/2019 | Na | G01S 7/4914 |
| 10,886,311 | B2 * | 1/2021 | Chen | H01L 27/1443 |
| 2017/0131389 | A1 * | 5/2017 | Na | G01S 17/894 |
| 2020/0091212 | A1 * | 3/2020 | Park | H01L 27/14603 |

(Continued)

FOREIGN PATENT DOCUMENTS

| WO | 2015004235 | 1/2015 | |
| WO | WO-2015004235 A1 * | 1/2015 | ....... H01L 27/14643 |
| WO | 2016061345 | 4/2016 | |

(Continued)

OTHER PUBLICATIONS

Search Report dated Jun. 2, 2020 issued by the European Patent Office for counterpart application 19217183.3-1230.

(Continued)

*Primary Examiner* — Steven M Christopher
(74) *Attorney, Agent, or Firm* — WPAT, P.C., Intellectual Property Attorneys; Anthony King

(57) ABSTRACT

A photodetecting device includes a substrate, a first photosensitive layer supported by the substrate, and a second photosensitive layer supported by the substrate and adjacent to the first photosensitive layer, each of the first photosensitive layer and the second photosensitive layer being coupled to a first doped portion having a first conductivity type, and a second doped region having a second conductivity type different from the first conductivity type, wherein the first photosensitive layer is separated from the second photosensitive layer, and the first doped portion coupled to the first photosensitive layer is electrically connected to the first doped portion coupled to the second photosensitive layer.

20 Claims, 22 Drawing Sheets

(56) References Cited

U.S. PATENT DOCUMENTS

2020/0119082 A1* 4/2020 Lee .................... H01L 27/1463
2020/0194486 A1* 6/2020 Na .................... H01L 27/14607

FOREIGN PATENT DOCUMENTS

WO  WO-2016061345 A1 * 4/2016  ....... H01L 27/14601
WO     2018105359      6/2018

OTHER PUBLICATIONS

English Abstract Translation of WO2015004235.
S. Koh et al., Fabrication of p-i-n Si0.5Ge0.5 photodetctors on SiGe-on-Insulator Substrates, 2004 1st IEEE International Conference on Group IV Photonics, pp. 61-63, 2010.
G. Du et al., Effect of interface roughness on the carrier transport in germanium Mosfe I s investigated by Monte Carlo method, Chin. Phys. B vol. 19, No. 5 (2010) 057304.

* cited by examiner

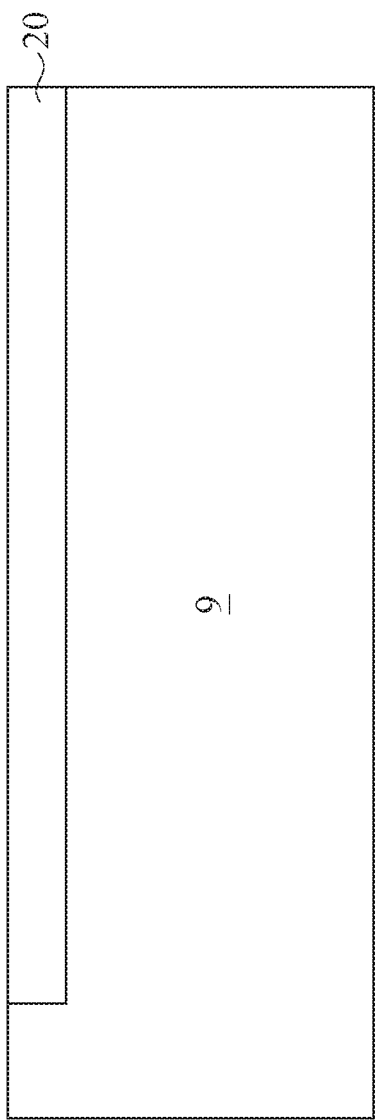

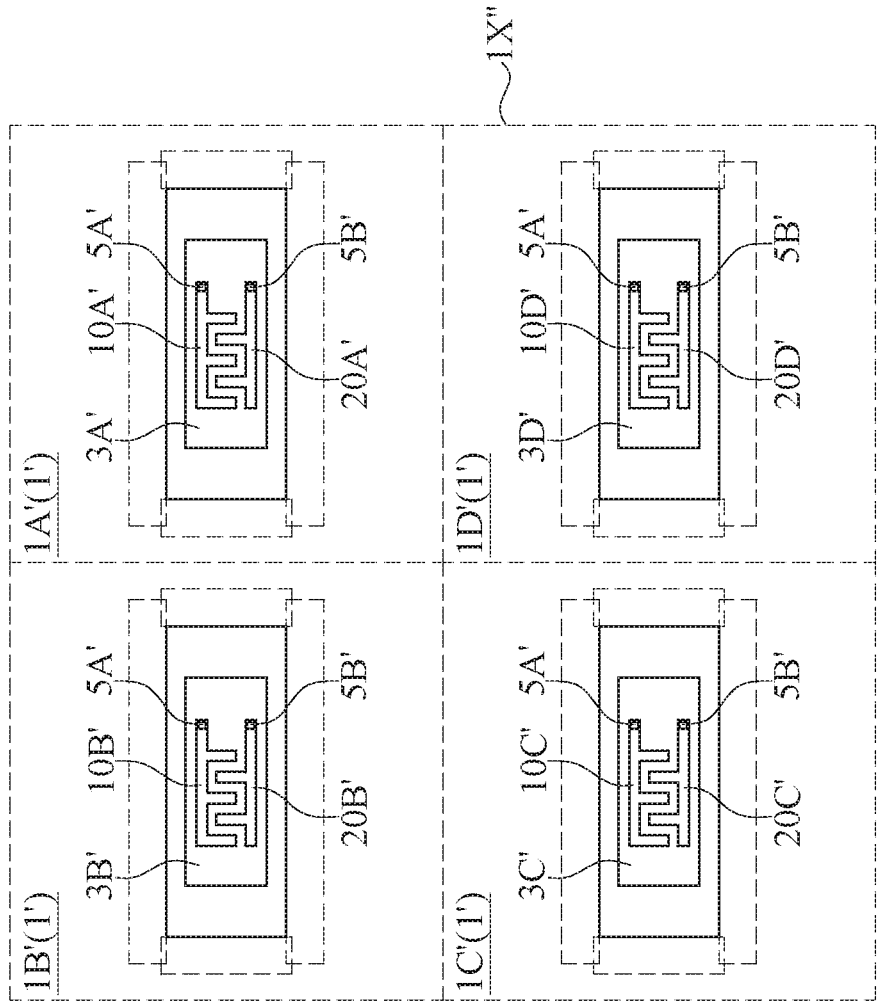
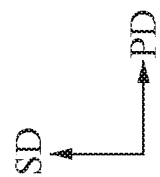
FIG. 6A

PHOTODETECTING DEVICE WITH ENHANCED COLLECTION EFFICIENCY

CROSS-REFERENCE TO RELATED APPLICATIONS

This patent application claims the benefit of U.S. Provisional Patent Application No. 62/780,337, filed Dec. 17, 2018 and U.S. Provisional Patent Application No. 62/786,389, filed Dec. 29, 2018, which are incorporated by reference herein.

BACKGROUND

For high-data-rate optical communication transceivers, a high-speed photodetector at the receiver is needed. To increase the speed of a photodetector, usually, many effects such as capacitance-limited resistance-capacitance delay time should be taken into consideration.

SUMMARY

According to an aspect of the present application, a photodetecting device is provided. The photodetecting device includes a substrate, a first photosensitive layer at least supported by the substrate, and a second photosensitive layer supported by the substrate and adjacent to the first photosensitive layer, each of the first photosensitive layer and the second photosensitive layer being coupled to: a first doped portion having a first conductivity type, and a second doped region having a second conductivity type different from the first conductivity type, wherein the first photosensitive layer is separated from the second photosensitive layer, and the first doped portion coupled to the first photosensitive layer is electrically connected to the first doped portion coupled to the second photosensitive layer.

According to an aspect of the present application, a photodetecting device is provided. The photodetecting device includes a substrate, a first photosensitive layer supported by the substrate, a second photosensitive layer supported by the substrate and adjacent to the first photosensitive layer, each of the first photosensitive layer and the second photosensitive layer having a top surface facing away from the substrate and a bottom surface opposite to the top surface, wherein each of the first photosensitive layer and the second photosensitive layer is coupled to: a first doped portion having a first conductivity type and proximal to the top surface, and a second doped region having a second conductivity type and proximal to the bottom surface, wherein the first photosensitive layer is separated from the second photosensitive layer.

According to an aspect of the present application, a photodetecting device is provided. The photodetecting device includes a first sub-pixel, including a first photosensitive layer having a top surface and a bottom surface, a first doped portion having a first conductivity type and exposed from the top surface of the first photosensitive layer, and a second doped region having a second conductivity type and coupled to the first photosensitive layer, an isolation region surrounding the first sub-pixel, and a second sub-pixel adjacent to the first sub-pixel and being separated from the first sub-pixel by the isolation region.

According to an aspect of the present application, a method for making a photodetecting device is provided. The method includes providing a substrate; forming a second doped region in the substrate; forming a plurality of photosensitive layers; forming a first doped portion in each of the photosensitive layers; and forming a routing layer electrically coupled to first doped portions of a plurality of photosensitive layers.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein:

FIG. 1E to FIG. 1L are cross sectional views of a photodetecting device during intermediate stages of manufacturing operations, according to some embodiments of the present disclosure.

FIG. 6A illustrates a top view of an array of photodetecting devices, according to some embodiments of the present disclosure.

DETAILED DESCRIPTION

Figure 1A:
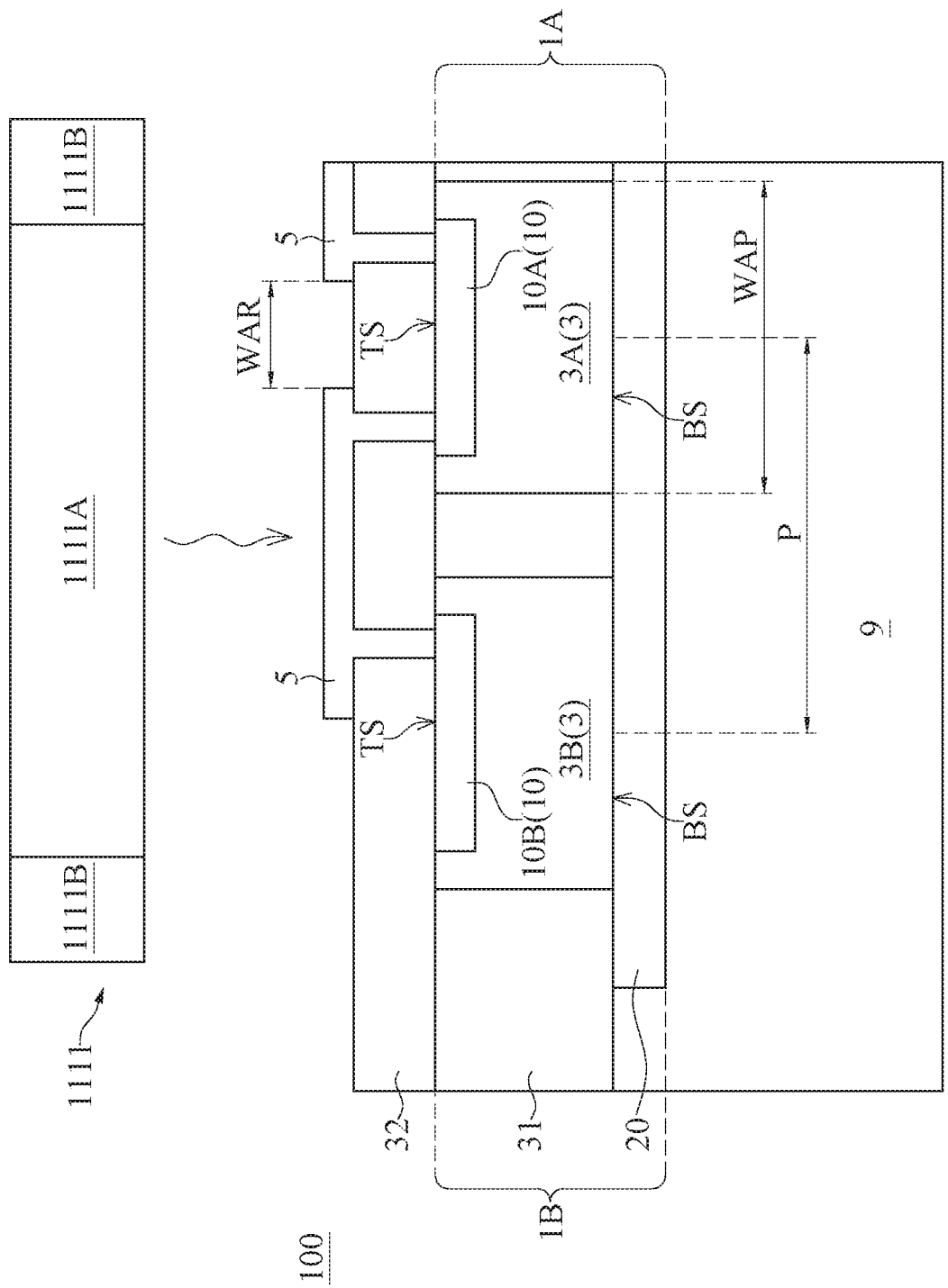
FIG. 1A illustrates a cross section of a photodetecting device, according to some embodiments of the present disclosure.

Spatial descriptions, such as "above," "top," and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

In the present disclosure, the term "germanium-silicon (GeSi)" refers to $aGe_xSi_{1-x}$, wherein $0<x<1$. The term "intrinsic" refers to a semiconductor material without intentionally adding dopants.

In optical communication application with operation bandwidth generally above 25 Gbps (e.g. 40 Gbps, 100 Gbps, or the like), a sensing aperture of a photodiode may be smaller compared to a sensing aperture of a photodiode with operation bandwidth generally under 25 Gbps for maintaining pixel performance, such as the modulation speed. In order to improve the speed of the photodiode, an optical aperture or an active area of the photodiode is decreased in consideration of capacitance-limited resistance-capacitance (RC) delay time. Although reducing the optical aperture or an active area of the photodiode can lead to a reduction in device capacitance, which typically results in an increase in photodetector bandwidth, a reduction in the amount of optical signal (i.e., number of photons) entering into the photodiode may also be expected. For example, for a given intensity of light per unit area, the reduction in the optical aperture or an active area of the photodiode leads to a reduction in detected light.

Operation speed or bandwidth of a photodiode can be an important performance parameter for applications that benefit from high speed detection of light. However, the optical communication between one single optical fiber (e.g., may be a single mode fiber with lens or a multi-mode optical fiber) and a smaller-sized optical aperture or an active area (for example, about 15 μm diameter, or the like) of a photodiode may suffer from serious coupling loss. For applications that benefit from both high bandwidth and high detection efficiency, implementation of an optical element enhancing light coupling efficiency, for example, an optical lens, may be beneficial. The optical lens can focus the incident optical signal to the active region of the photodetector, allowing a small-area optical aperture or active area to detect optical signal incident over an area larger than itself.

In a comparative embodiment, when a photodiode includes a single, larger-sized optical aperture or an active area (for example, about 50 μm in diameter) for receiving incident light from a single optical fiber, a larger lens (such as a giant micro-lens, GML) for covering the corresponding area (for example, about 50 nm in diameter) and having a larger height (for example, about 25 μm) over the photodiode may be implemented. However, the fabrication process of such GML is difficult and often requires higher cost.

Therefore, the present disclosure provides a photodetecting device that includes a binned photodiode array having a plurality of discrete active areas (or photo-sensitive regions) for receiving optical signal coming from a single optical fiber (e.g., may be a single mode fiber with lens or a multi-mode optical fiber). Each of the photodiodes in the binned photodiode array may be referred to as a sub-pixel in the present disclosure. A lower-cost, easier-to-fabricate micro-lens (e.g., continuous micro-lens, CML) can be implemented with respect to each of the photodiodes in the binned photodiode array. Furthermore, the present disclosure also provides an improved arrangement of the plurality of sub-pixels.

Figure 1B:
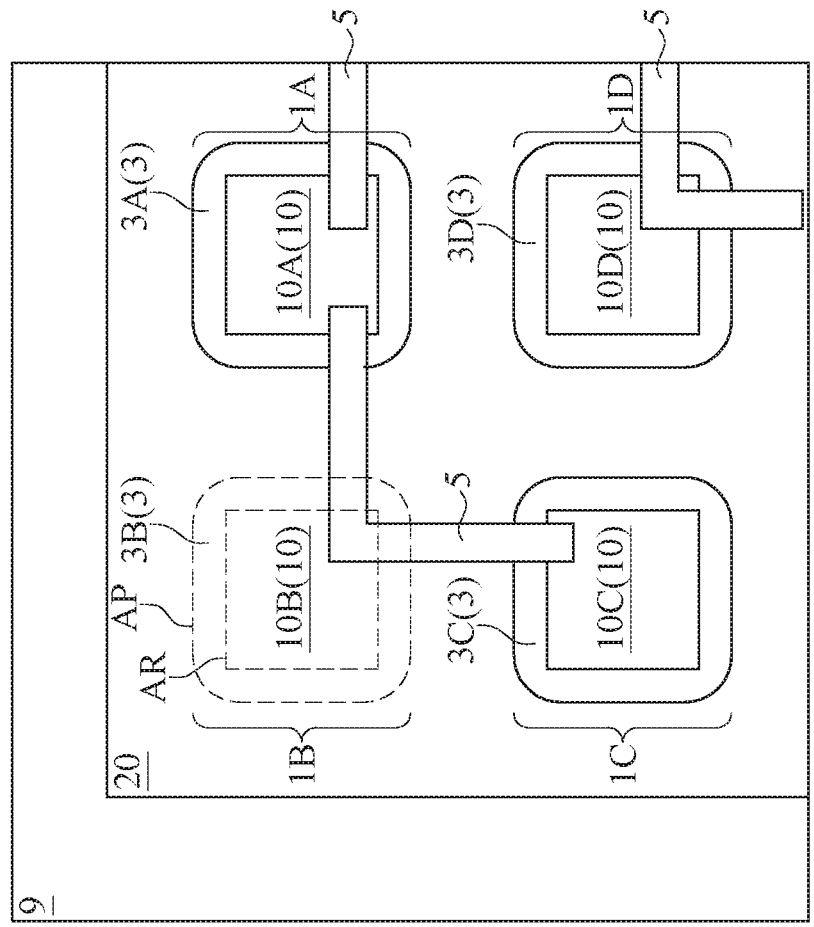
FIG. 1B illustrates a top view of a photodetecting device, according to some embodiments of the present disclosure.

Referring to FIG. 1A and FIG. 1B, FIG. 1A illustrates a cross section of a photodetecting device according to some embodiments of the present disclosure. FIG. 1B illustrates a top view of the photodetecting device corresponding to the photodetecting device in FIG. 1A. A photodetecting device 100 at least includes a substrate 9, a first sub-pixel 1A at least partially over the substrate 9, and a second sub-pixel 1B at least partially over the substrate 9. The first sub-pixel 1A includes a p-i-n structure having, for example, a first photosensitive layer 3A, a first doped portion 10A, and a second doped region 20. The second sub-pixel 1B includes another p-i-n structure having, for example, a second photosensitive layer 3B, a first doped portion 109, and a second doped region 20. In some embodiments, the first photosensitive layer 3A and the second photosensitive layer 3B are collectively referred to as a photo sensing area 3.

The substrate 9 may include any suitable substrate where photo sensing area 3 can be fabricated thereon. In some embodiment, the substrate 9 provides a surface for epitaxially growing the photo sensing area 3. In some embodiments, the substrate 9 includes a semiconductor material. In some embodiments, the substrate 9 includes a Group III-V semiconductor material. The Group III-V semiconductor material may include, but is not limited to, GaAs, AlAs, InP, InGaAs, GaSb, InAs, or InSb. In some embodiments, the substrate 9 includes a Group IV element. In some embodiments, the substrate 9 is composed of a single material, for example, the substrate 9 may be a silicon substrate. In some embodiments, the substrate 9 includes multiple materials, for example, the substrate 9 includes an insulating material and a semiconductor material. In some embodiments, the substrate 9 includes oxide, nitride, dielectric material, the combination thereof, or the like. In some embodiment, the substrate 9 includes $SiO_2$ and Si. In some embodiments, the substrate 9 includes a stack of multiple layers. In some embodiments, the substrate 9 includes a thickness not less than 100 μm.

In general, the photo sensing area 3 receives an optical signal, for example, an optical signal from an optical fiber 1111, and converts the optical signal into electrical signals. In some embodiments, the photodetecting device 100 is a front-side illumination configuration, in which the optical signal is incident on a top surface of the photo sensing area 3. In some embodiments, the photo sensing area 3 absorbs photons and generates electron-hole pairs. The photo sensing area 3 is selected to have a high absorption coefficient at the desired wavelength range, such as not less than $10^{-1}$ $cm^{-1}$. In some embodiments, the photo sensing area 3 is configured to absorb photons having a peak wavelength in an invisible wavelength range not less than 800 nm, such as 850 nm, 940 nm, 1050 nm, 1064 nm, 1310 nm, 1350 am, or 1550 nm. In some embodiments, the invisible wavelength range is not more than 2000 nm. In some embodiments, a material of the photo sensing area 3 is different from the material of the substrate 9. In some embodiments, the photo sensing area 3 includes a semiconductor material. In some embodiments, the photo sensing area 3 includes a Group semiconductor material. The Group III-V semiconductor material may include, but is not limited to, GaAs, AlAs, InP, InGaAs, GaSb, InAs, or InSb. In some embodiments, the bandgap of the material of the photo sensing area 3 is less than the bandgap of the material of the substrate 9. In some embodiments, the photo sensing area 3 includes a semiconductor material including a Group IV element, for example, Ge, Si or Sn. In some embodiments, the photo sensing area 3 includes GeSi, wherein the composition of germanium and silicon may be selected for specific processes or applications. In some embodiments, the material of the photo sensing area 3 is intrinsic. In some embodiments, the photo sensing area 3 is composed of intrinsic germanium.

Referring to FIG. 1A, the first photosensitive layer 3A is separated from the second photosensitive layer 3B by, for example, a first dielectric layer 31 disposed between a sidewall of the first photosensitive layer 3A and a sidewall of the second photosensitive layer 3B facing the first photosensitive layer 3A. Each of the first photosensitive layer 3A and the second photosensitive layer 3B has a top surface TS facing away from the substrate 9 and bottom surface BS opposite to the top surface TS. In some embodiments, the first sub-pixel 1A includes the first doped portion 10A beneath the top surface TS of the first photosensitive layer 3A and coupled to the first photosensitive layer 3A. The second sub-pixel 1B includes the first doped. portion 10B beneath the top surface TS of the second photosensitive layer 3B and coupled to the second photosensitive layer 3B. The first doped portion 10A coupled to the first photosensitive layer 3A and the first doped portion 10B coupled to the second photosensitive layer 3B are physically separated. In some embodiments, the first doped portion 10A of the first sub-pixel 1A and the first doped portion 10B of the second sub-pixel 1B are collectively referred to as a first doped region 10, which has a first conductivity type (e.g., n or p). The first doped portion 10A and the first doped portion 10B may be at least partially exposed from the first photosensitive layer 3A and the second photosensitive layer 3B, respectively, and electrically connected to a routing layer 5 over the photo sensing area 3. The specific layout of the first doped portion 10A, 10B, include suitable depth or shape of the doping profile, and may be varied depending on different design, manufacturing process, or testing considerations.

In some embodiment, each of the first sub-pixel 1A and the second sub-pixel 1B further includes an interface layer (not shown) covering the top surface TS of the first photosensitive layer 3A and the top surface TS of the second photosensitive layer 3B, respectively. In some embodiment, the interface layer (not shown) of the first sub-pixel 1A further covers a sidewall of the first photosensitive layer 3A. In some embodiment, the interface layer (not shown) of the second sub-pixel 1B further covers a sidewall of the second photosensitive layer 3B. The interface layer may include a material different from the material of the photo sensing area 3. In some embodiments, the interface layer may include amorphous silicon, polysilicon, epitaxial silicon, aluminum oxide (e.g., $Al_xO_y$), silicon oxide (e.g., $Si_xO_y$) Ge oxide (e.g., $Ge_xO_y$), germanium-silicon (e.g., (GeSi), silicon nitride family (e.g., $Si_xN_y$), high-k materials (e.g. $HfO_x$, $ZnO_x$, $LaO_x$, $LaSiO_x$), and any combination thereof. The presence of the interface layer may have various effects. For example, the interface layer may act as a surface passivation layer to the photo sensing area 3, which may reduce dark current generated by defects present at the exposed surface of the photo sensing area 3. In some embodiment, the interface layer (not shown) of the first sub-pixel 1A and the interface layer (not shown) of the second sub-pixel 1B may be a continuous layer.

The first photosensitive layer 3A and the second photosensitive layer 3B are each coupled to the second doped region 20 having a second conductivity type (e.g., p or n). The second doped region 20 is proximal to the bottom surface BS of the first photosensitive layer 3A or the bottom surface BS of the second photosensitive layer 3B. For example, each of the top surface TS of the first photosensitive layer 3A and the top surface TS of the second photosensitive layer 3B are coupled to the first doped region 10, and the each of the bottom surface BS of the first photosensitive layer 3A and the bottom surface BS of the second photosensitive layer 3B are coupled to a second doped region 20 having a second conductivity type different from, or opposite to, the first conductivity type. In some embodiments, the first conductivity type is p-type and the second conductivity type is n-type. In some other embodiments, the first conductivity type is n-type and the second conductivity type is p-type. In some embodiments, the second doped region 20 coupled to the first photosensitive layer 3A and the second doped region 20 coupled to the second photosensitive layer 3B are connected. In some embodiments, the second doped region 20 may be a continuous doped region formed in the substrate 9. In some embodiments, an area of the second doped region 20 of the photodetecting device 100 is greater than an area of each of the first doped portions 10A or 10B in the corresponding photosensitive layer 3A or 3B. In some embodiments, an area of the second doped region 20 of the photodetecting device 100 is greater than a total area of the first doped portions 10A and 10B sums up from each of the photosensitive layer 3A and 3B in the photodetecting device 100.

In some embodiments, the photo sensing area 3 is laterally surrounded by the first dielectric layer 31, and a top surface of the first sub-pixel 1A is not covered by the first dielectric layer 31. In some embodiments, the top surface of the first sub-pixel 1A and the top surface of the second sub-pixel 1B are coplanar with a top surface of the first dielectric layer 31 from the cross section of the photodetecting device. In some embodiments, the first dielectric layer 31 includes suitable insulating materials such as oxides or nitrides. A second dielectric layer 32 can be disposed above the first dielectric layer 31, the first sub-pixels 1A and the second sub-pixel 1B. In some embodiments, the second dielectric layer 32 includes suitable insulating materials such as oxides or nitrides. The second dielectric layer 32 may or may not be composed of the same materials as the first dielectric layer 31.

Referring to FIG. 1A, the first doped portion 10A of the first sub-pixel 1A and the first doped portion 108 of the second sub-pixel 16 are electrically connected by the routing layer 5, which includes conductive material such as metal or alloy, for example, Al, Cu, W, Ti, Ta TaN—Cu stack, Ti—TiN—W stack. In some embodiments, the routing layer 5 penetrates the second dielectric layer 32 and has a portion extends above the second dielectric layer 32. In some embodiments, a portion of the first doped region 10 is under a projection area of the routing layer 5. The routing layer 5 at least electrically connects the first doped portion 10A of the first sub-pixel 1A and the first doped portion 10B of the second sub-pixel 1B. In some embodiments, a layout of the routing layer 5 may connect some of the sub-pixels in parallel. For example, the routing layer 5 is not necessary to connect the respective first doped portions 10A in adjacent sub-pixels. The specific layout of the routing layer 5, including but not limited to the number of layers in metal connection and the electrical arrangement among several sub-pixels of the photodetecting device 100, may be varied depending on different design, manufacturing process, or testing considerations.

In some embodiments, the routing layer 5 can be replaced by a highly-doped semiconductor layer electrically coupling respective first doped portions of each of the sub-pixels. For example, a highly-doped amorphous silicon layer may be deposited over the coplanar surface of the first photosensitive layer 3A, the second photosensitive layer 3B, and the first dielectric layer 31 to provide parallel electrical connection among various photosensitive layers.

Referring to FIG. 1A, the first photosensitive layer 3A has a width WAP measured from one sidewall to the opposite sidewall of the first photosensitive layer 3A. In some embodiments, assuming the first photosensitive layer 3A possesses roughly a square shape from a top view perspective (e.g., as illustrated in FIG. 1B), when the width WAP of the first photosensitive layer 3A is about 7 µm, an active area AP of about 49 µm² can be obtained. In some embodiments, the active area AP of each sub-pixel is defined as the area of the photosensitive layer. As previously discussed, a portion of the first doped portion 10A and the first photosensitive layer 3A are under a projection area of the routing layer 5. As a result, the optical signal received by the first photosensitive layer 3A is reduced due to the coverage of the routing layer 5. In some embodiments, the routing layer 5 has an opening for allowing an optical signal entering into the photo sensing area 3. The opening of the routing layer 5 having a width WAR can be identified in FIG. 1A. Similarly, when the width WAR of the opening is about 5 µm, an optical aperture area AR (e.g., as illustrated in FIG. 1B) of about 25 µm² can be obtained. In some embodiments, the optical aperture area AR of each sub-pixel is defined as the area of the opening. In some embodiments, a pitch P between two adjacent photosensitive layers 3A, 3B is determined by the width WAP and the distance between the separated and adjacent photosensitive layers 3A, 3B. In some embodiments, a pitch P is between the centers of two adjacent photosensitive layers 3A, 3B. For example, the pitch P may be 10 µm, which is larger than the width WAP of 7 µm and the width WAR of 5 µm. In some embodiments, the pitch P is not less than 5 µm. In some embodiments, the width WAP is not less than 3 µm.

As previously discussed, the optical fill factor of the first photosensitive layer 3A can be the optical aperture area AR over the square of the pitch P. In some embodiments, the optical fill factor is not less than 20%. For example, from the embodiment as previously discussed, i.e., 25 µm²/100 µm², which, in some embodiments, is close to 25%. The aforesaid optical fill factor can be altered by the design rule of the photosensitive layers 3A, 3B, as well as the design rule of the routing layer 5, and may be further improved, for example, greater than 25%.

The numbers of sub-pixels 1A, 1B in the photodetecting device 100 for receiving optical signal from the core 1111A of the optical fiber 1111 is not limited to two. In the case of the photodetecting device 100 having multiple sub-pixels, the multiple sub-pixels may under a vertical projection of the core 1111A of the optical fiber 1111, wherein at least two of the sub-pixels are binned together (e.g., electrically connected). In some embodiments, the numbers of sub-pixels in the photodetecting device 100 can be more than two, for example, four (as exemplified in FIG. 1B). In the case of the photodetecting device 100 having four sub-pixels, which are respectively associated with the first photosensitive layer 3A, the second photosensitive layer 3B, the third photosensitive layer 3C, and the fourth photosensitive layer 3D in FIG. 1B, the four sub-pixels 1A, 1B, 1C, and 1D may under a vertical projection of the core 1111A of the optical fiber 1111. Alternatively stated, an optical fiber 1111 is optically coupled to an area of approximately 20 µm by 20 µm and having four sub-pixels binned together (e.g., electrically connected), each of the sub-pixels being previously described in FIG. 1A. The optical fiber 1111 can be a single mode with lens or a multi-mode fiber which has a core 1111A and a cladding 1111B.

In some embodiments, the numbers of sub-pixels in the photodetecting device 100 can be more than four, for example, sixteen. In the case of the photodetecting device 100 having sixteen sub-pixels, the sixteen sub-pixels may be arranged in a four by four array, and are disposed under a vertical projection of the core 1111A of the optical fiber 1111. Alternatively stated, an optical fiber 1111 is optically coupled to an area of approximately 40 µm by 40 µm and having sixteen sub-pixels binned together (e.g., electrically connected), each of the sub-pixels being previously described in FIG. 1A. The number of the sub-pixel binned together may vary depending on different design, manufacturing process, or testing considerations.

By having a plurality of sub-pixels receiving optical signal from a core 1111A of the optical fiber 1111, the collection efficiency of the optical signal can be improved, and the coupling loss of the optical communication between the optical fiber 1111 and the photodetecting device 100 can be alleviated.

Figure 1C:
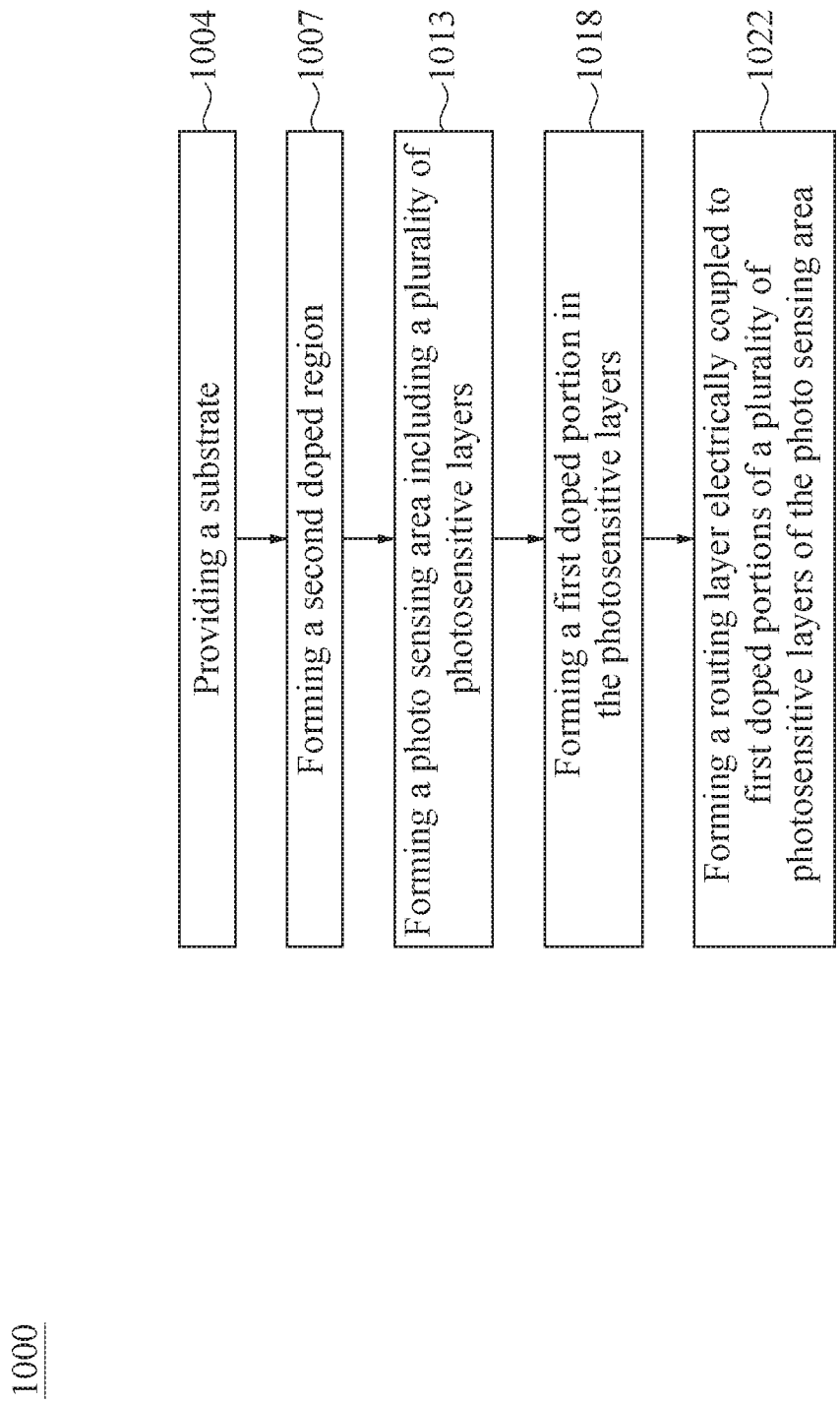
FIG. 1C shows a flow chart representing a method for fabricating a photodetecting device, in accordance with some embodiments of the present disclosure.

Referring to FIG. 1C, FIG. 1C shows a flow chart representing a method for fabricating a photodetecting device, in accordance with some embodiments of the present disclosure. FIG. 1C shows an example of a method 1000 for forming the photodetecting device 100 previously discussed in FIG. 1A and/or FIG. 1B. The method 1000 for forming the photodetecting device 100 includes providing a substrate (operation 1004, which can be referred to FIG. 1E), forming a second doped region in the substrate (operation 1007, which can be referred to FIG. 1E), forming a photo sensing area including a plurality of photosensitive layers (operation 1013, which can be referred to FIG. 1F to FIG. 1G), forming a first doped region in the photo sensing area, that is, forming a first doped portion in each of the photosensitive layers (operation 1018, which can be referred to FIG. 1H), and forming a routing layer electrically coupled to first doped portions of a plurality of photosensitive layers of the photo sensing area (operation 1022, which can be referred to FIG. 1L).

Figure 1D:
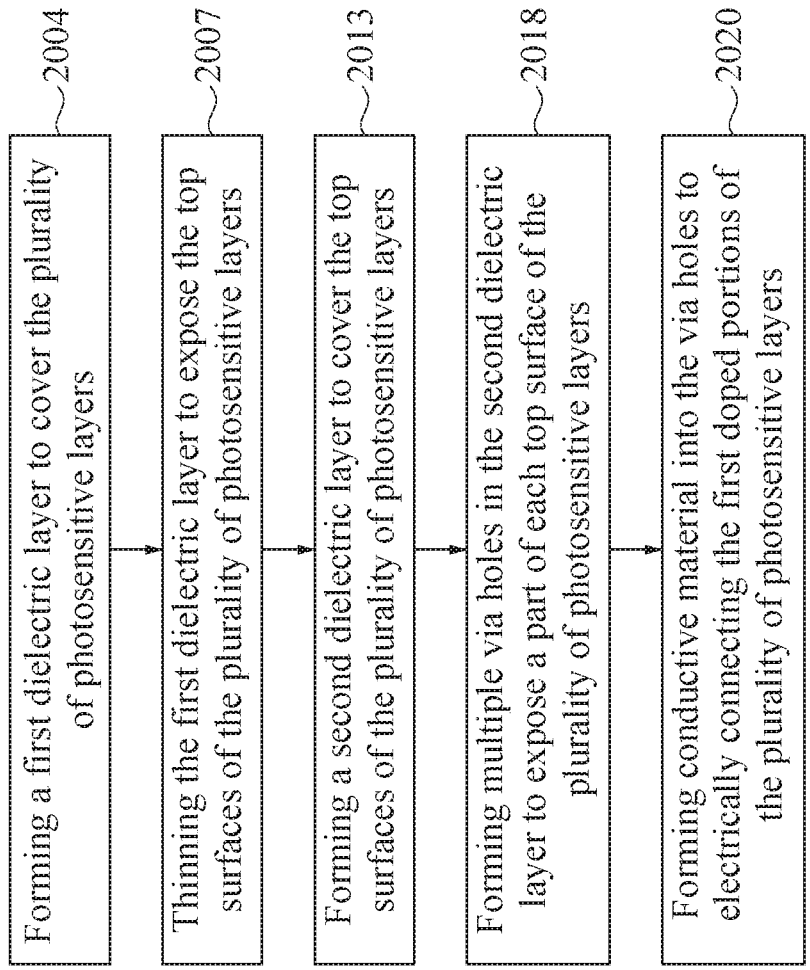
FIG. 1D shows a flow chart representing a method for fabricating a routing layer of a photodetecting device, in accordance with some embodiments of the present disclosure.

Referring to FIG. 1D, FIG. 1D shows a flow chart representing a method for fabricating a routing layer of a photodetecting device, in accordance with some embodiments of the present disclosure. The step of forming a routing layer electrically coupled to first doped portions of a plurality of photosensitive layers of the photo sensing area (operation 1022) further includes forming a first dielectric layer to cover the plurality of photosensitive layers (sub-operation 2004, which can be referred to FIG. 1I), thinning the first dielectric layer to expose the top surfaces of the plurality of photosensitive layers (sub-operation 2007, which can be referred to FIG. 1J), forming a second dielectric layer to cover the top surfaces of the plurality of photosensitive layers (sub-operation 2013, which can be referred to FIG. 1K), forming multiple via holes in the second dielectric layer to expose a part of each top surface of the plurality of photosensitive layers 3 (sub-operation 2018, which can be referred to FIG. 1K), and forming conductive material into the via holes to electrically connecting the first doped portions of the plurality of photosensitive layers (sub-operation 2020, which can be referred to FIG. 1L).

Referring to FIG. 1E, FIG. 1E is a cross sectional view of a photodetecting device during intermediate stages of manufacturing operations, according to some embodiments of the present disclosure. Specifically, the steps for forming the photodetecting device 100 includes providing a substrate 9, and forming the second doped region 20 beneath a top surface of the substrate 9. In some embodiments, the second doped region 20 in the substrate 9 can be of any suitable depth and concentration profile, such as between $1 \times 10^{18}$ cm$^{-3}$ to $5 \times 10^{21}$ cm$^{-3}$. The second doped region 20 can be formed by suitable ion implantation operations. In some embodiments, the second doped region 20 is an n-doped region. It should be appreciated by people having ordinary skill in the art that the second doped region 20 can be a p-doped region depending on various design, manufacturing process, or testing considerations.

Figure 1F:
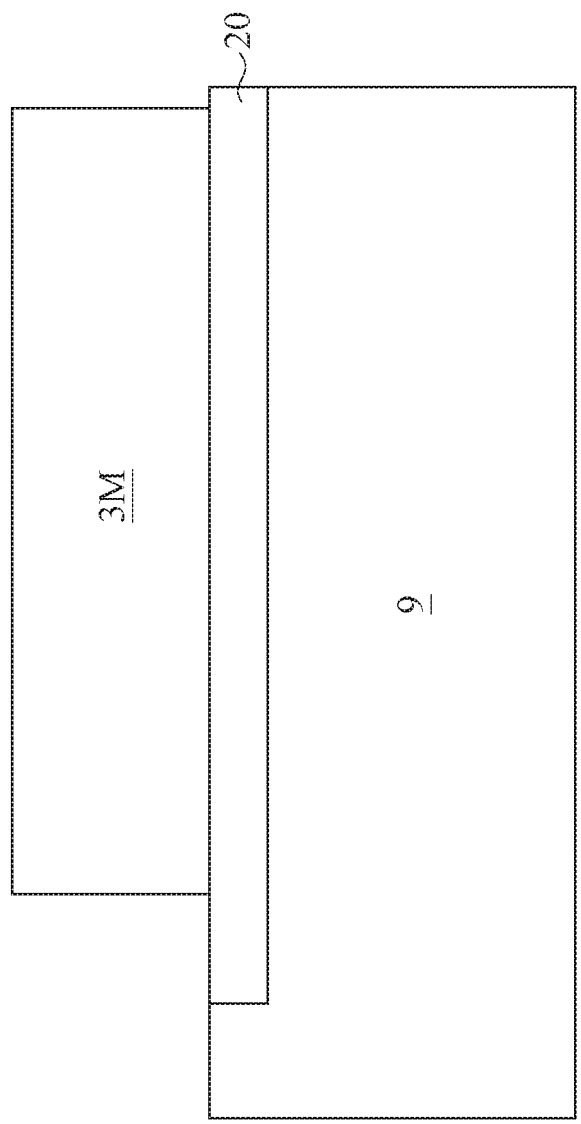

Referring to FIG. 1F, FIG. 1F is a cross sectional view of a photodetecting device during intermediate stages of manufacturing operations, according to some embodiments of the present disclosure. A photosensitive material 3M is formed, such as deposited over the substrate 9 in such a way that the photosensitive material 3M is in contact with the second doped region 20. In some embodiments, the deposition of the photosensitive material 3M may include various deposition operation, including, but not limited to, a blanket epitaxy, a selective epitaxy, or other applicable techniques. In some embodiment, a buffer layer (not shown) is formed between the substrate 9 and the photosensitive material 3M for improving the epitaxial quality of the photosensitive material 3M formed thereon. In some embodiments, the buffer layer includes a material the same as the substrate but with conductivity type different from the second conductivity type. For example, when the substrate includes Si and the second conductivity type is n-type, the buffer layer includes intrinsic silicon. The buffer layer has a thickness between 50 nm and 200 nm both inclusive. The top surface of the of the substrate 9 is depicted as a planar surface, In some embodiments, the substrate 9 may include a mesa or a trench, and thus the top surface is not a planar surface, wherein the top surface at least partially surrounded by an insulator ex: oxide, nitrite), a semiconductor (ex: Si, Ge), or their combinations. Furthermore, a strained super lattice structure or a multiple quantum well structure including alternative layers such as two or more different semiconductor compounds or semiconductor compounds having the same elements but with different compositions may be implemented as the photosensitive material 3M. For example, alternating GeSi layers with different compositions.

Figure 1G:
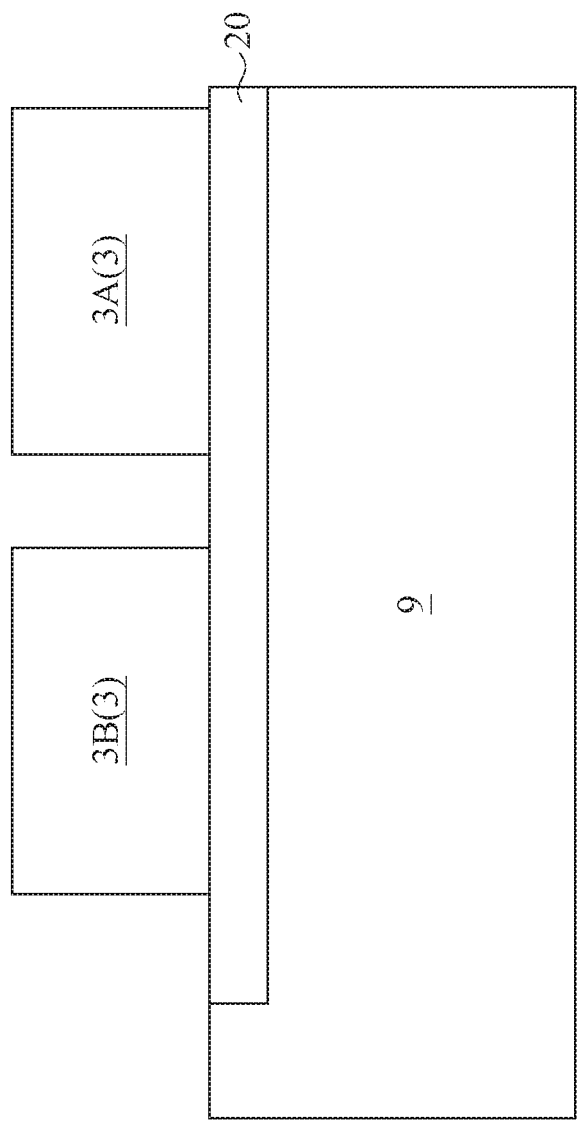

Referring to FIG. 1G, FIG. 1G is a cross sectional view of a photodetecting device during intermediate stages of manufacturing operations, according to some embodiments of the present disclosure. After forming the photosensitive material 3M, the photosensitive material 3M is then patterned to obtain a photo sensing area 3 including a plurality of photosensitive layers 3A, 3B by performing an etching operation. In the example of FIG. 1B, four discrete photosensitive layers 3A, 3B, 3C, and 3D are formed after the aforesaid etching operation. In some embodiments, the removal operation may include, but not limited to, a dry etching and/or a wet etching operations. In some embodiments, at least a portion of the second doped region 20 is exposed from the photo sensing area 3 after the etching operation, for example, a portion of the second doped region 20 may expose to a space between the first photosensitive layers 3A and the second photosensitive layers 3B. As previously discussed in FIG. 1A and FIG. 1B, the first photosensitive layer 3A, the second photosensitive layer 3B, the third photosensitive layer 3C and/or the fourth photosensitive layer 3D (as shown in the example of FIG. 1B) are physically separated from each other. In some embodiments, the steps of forming the photodetecting device 100 further include forming an interface layer (not shown) covering at least the top surface of the first photosensitive stayer 3A, the top surface of the second photosensitive layer 3B, the top surface of the third photosensitive layer 3C and/or the, the top surface of the fourth photosensitive layer 3D.

Figure 1H:
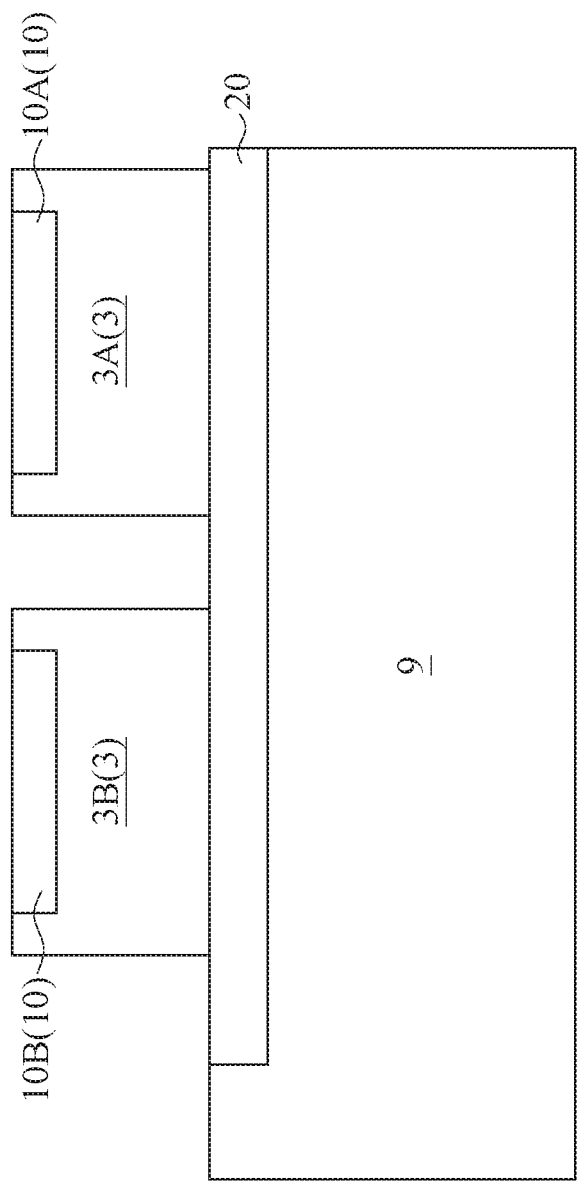
Figure 11:
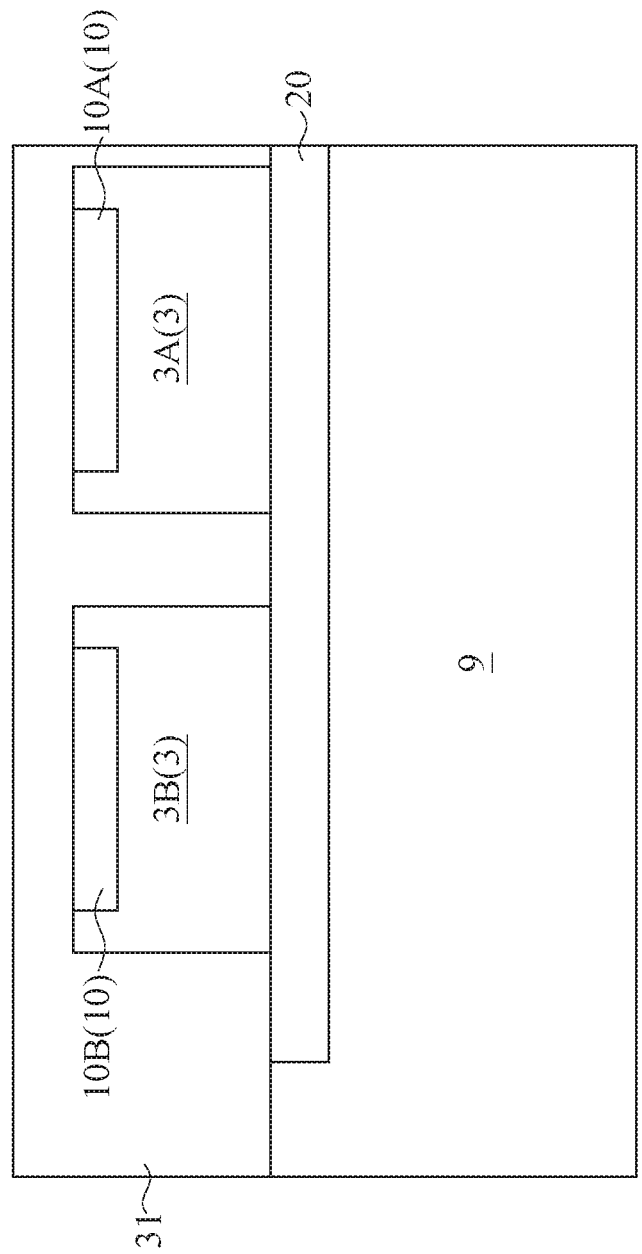

Referring to FIG. 1H, FIG. 1H is a cross sectional view of a photodetecting device during intermediate stages of manufacturing operations, according to some embodiments of the present disclosure. The steps of forming the photodetecting device 100 further include forming a first doped region 10 in the photo sensing area 3. Alternatively stated, each of the first doped portions 10A, 10B, 10C, 10D is respectively formed in the corresponding discrete photosensitive layers 3A, 3B, 3C and 3D. The first doped region 10 can be formed by suitable ion implantation operations with a proper masking layout. In some embodiments, ions may also be implanted into the interface layer covering the top surfaces of the photosensitive layers 3A, 3B to form doped interface layers (not shown) in a one-to-one correspondence with each of the first doped portions 10A, 10B, 10C, 10D of the photosensitive layers 3A, 3B, 3C and 3D. In some embodiments, the interface layer includes amorphous silicon. In some embodiments, the first doped region 10 in the photosensitive layers 3A, 3B, 3C and 3D can be of any suitable depth and concentration profile, such as between $1 \times 10^{18}$ cm$^{-3}$ to $5 \times 10^{21}$ cm$^{-3}$. In some embodiments, each of the first doped portions 10A, 10B, 10C, 10D may beneath the entire or a portion of the top surface of each of the photosensitive layers 3A, 3B, 3C and 3D. In some embodiments, the first doped region 10 is a p-doped region. It should be appreciated by people having ordinary skill in the art that the first doped region 10 can be an n-doped region depending on various design, manufacturing process, or testing considerations.

Referring to FIG. 1I, FIG. 1I is a cross sectional view of a photodetecting device during intermediate stages of manufacturing operations, according to some embodiments of the present disclosure. The steps of forming the photodetecting device 100 further include forming a first dielectric layer 31 to laterally surround each of the photosensitive layers 3A, 3B. In some embodiments, the first dielectric layer 31 may be firstly deposited over an exposed portion of the second doped region 20, in some embodiments, the first dielectric layer 31 includes suitable insulating materials such as oxide, nitrides, or combinations thereof.

Figure 1J:
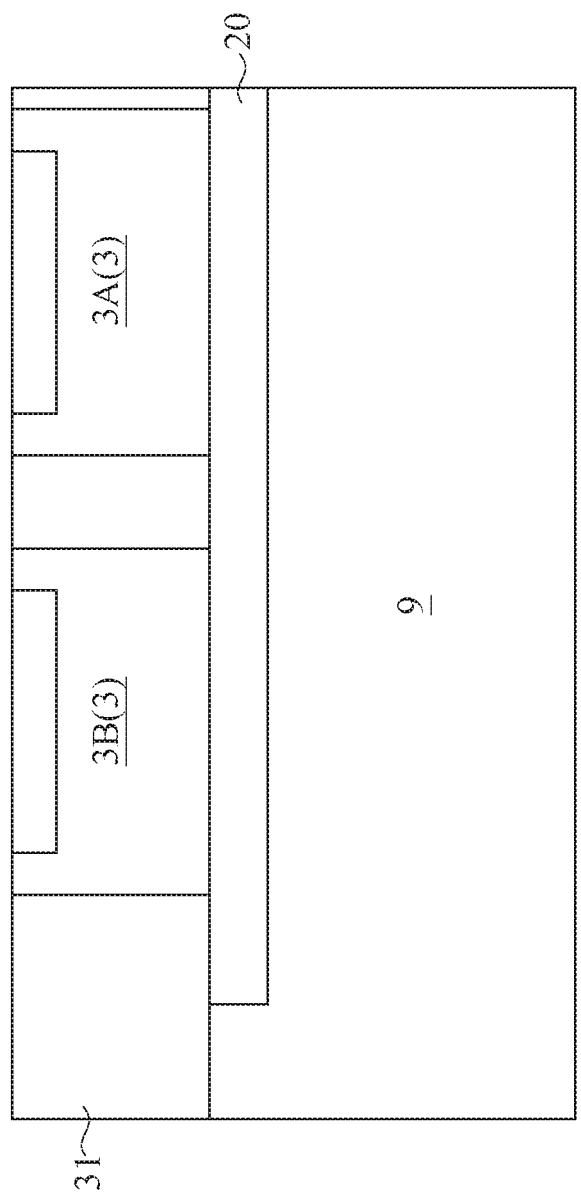

Referring to FIG. 1J, FIG. 1J is a cross sectional view of a photodetecting device during intermediate stages of manufacturing operations, according to some embodiments of the present disclosure. A thinning operation can be performed to remove a portion of the first dielectric layer 31 over the photo sensing area 3 until a top surface of the photosensitive layers 3 and the first doped region 10 is exposed. In some embodiments, the thinning operation is a planarization operation, such as chemical mechanical planarization (CMP) operation. In some of the embodiments, a top surface of the photo sensing area 3 after the thinning operation is substantially coplanar with a top surface of the first dielectric layer 31.

Figure 1K:
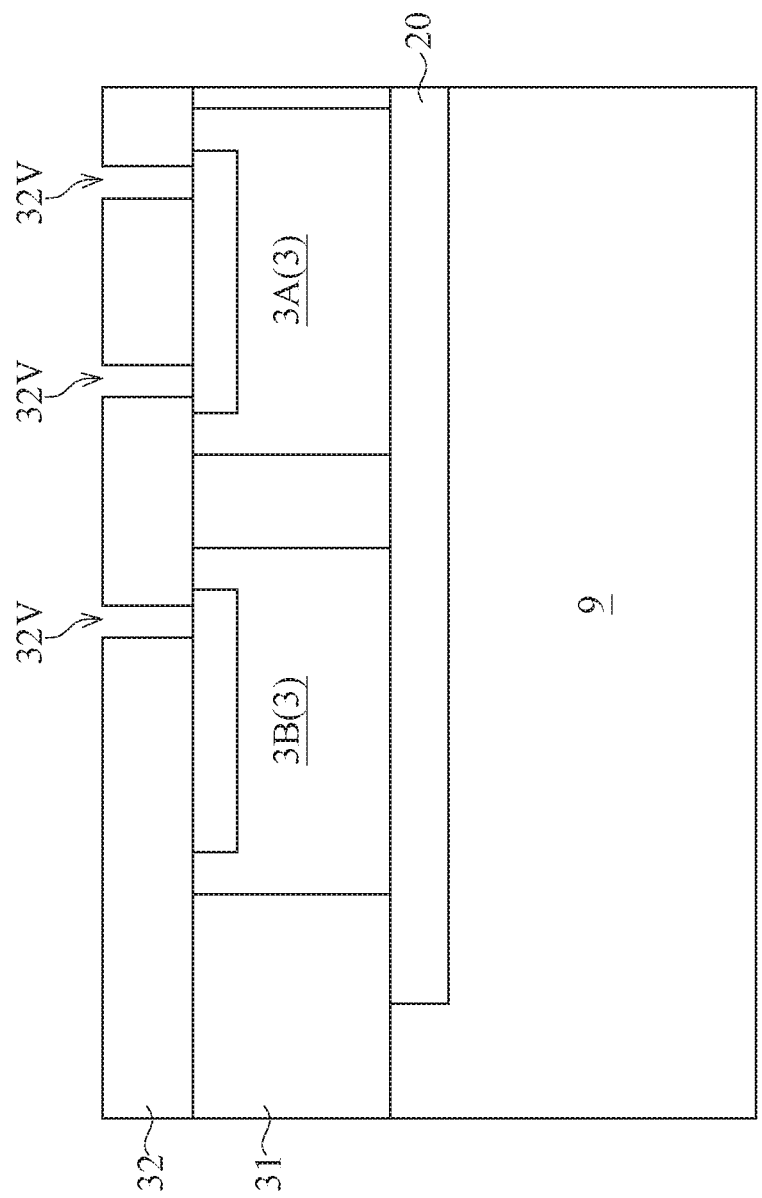

Referring to FIG. 1K, FIG. 1K is a cross sectional view of a photodetecting device during intermediate stages of manufacturing operations, according to some embodiments of the present disclosure. A second dielectric layer 32 is formed over the coplanar surface of the first dielectric layer 31 and the photosensitive layers 3. In some embodiments, the second dielectric layer 32 includes suitable insulating materials such as oxide, nitride, or combinations thereof. The first dielectric layer 31 may be composed of identical or different materials than the second dielectric layer 32. Subsequently, a plurality of via holes 32V penetrating the second dielectric layer 32 are formed in the second dielectric layer 32 by a suitable lithography operation. A portion of the top surface of the photo sensing area 3 is then exposed from the second dielectric layer 32 after the lithography operation.

Figure 1L:
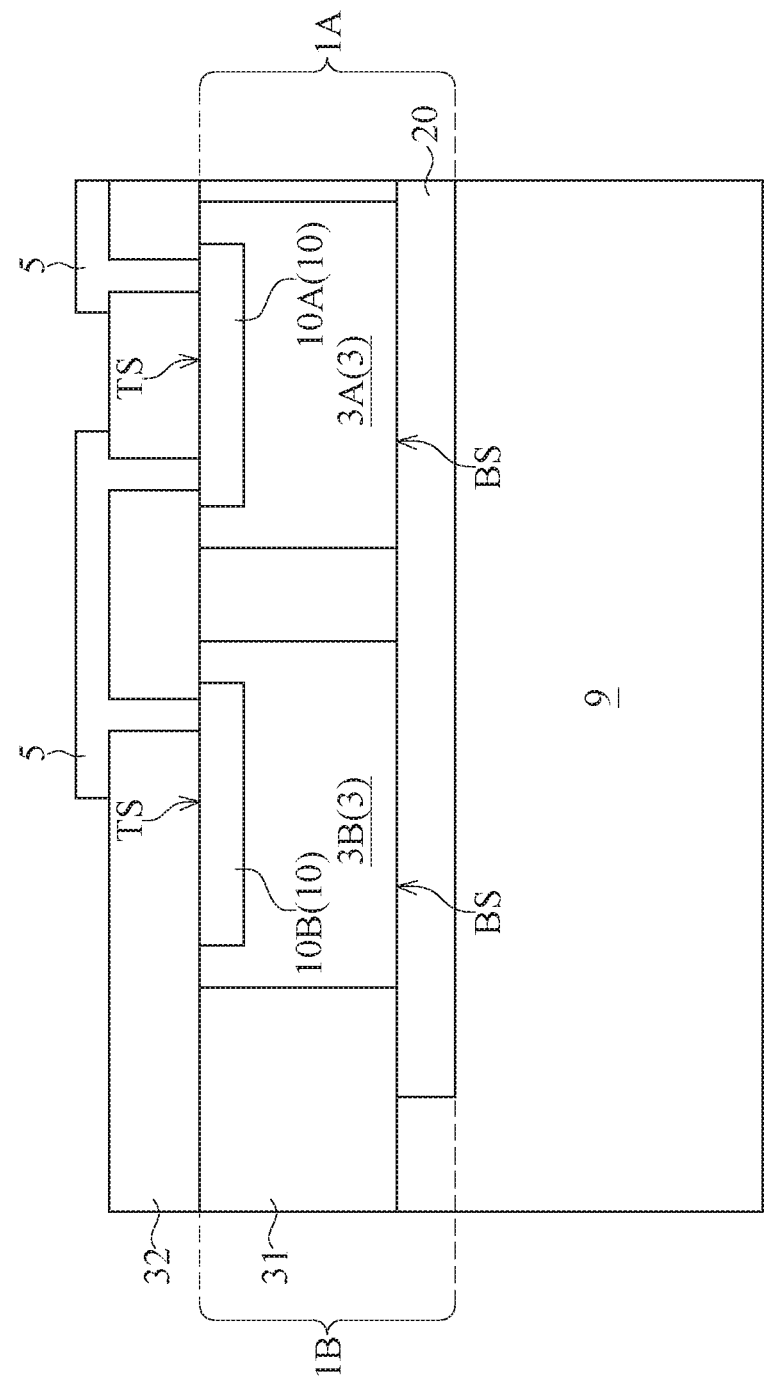

Referring to FIG. 1L, FIG. 1L is a cross sectional view of a photodetecting device during intermediate stages of manufacturing operations, according to some embodiments of the present disclosure. The steps of forming the photodetecting device further include forming a routing layer 5 electrically coupled to the multiple first doped portions in the plurality of photosensitive layers the first doped portions 10A, 10B, 10C, 10D in the photosensitive layers 3A, 3B, 3C and 3D, respectively). In some embodiments, the routing layer 5 is electrically coupled to the first doped portions 10A, 10B, 10C, 10D in the plurality of photosensitive layers 3A, 3B, 3C and 3D through the doped interface layers. Specifically, a conductive material, such as metal or alloy, is filled into the via holes 32V to form electrical contact to the first doped region 10. Furthermore, the conductive material is further sputtered over the second dielectric layer 32 to complete the metal line routing after a suitable patterning operation.

Figure 2A:
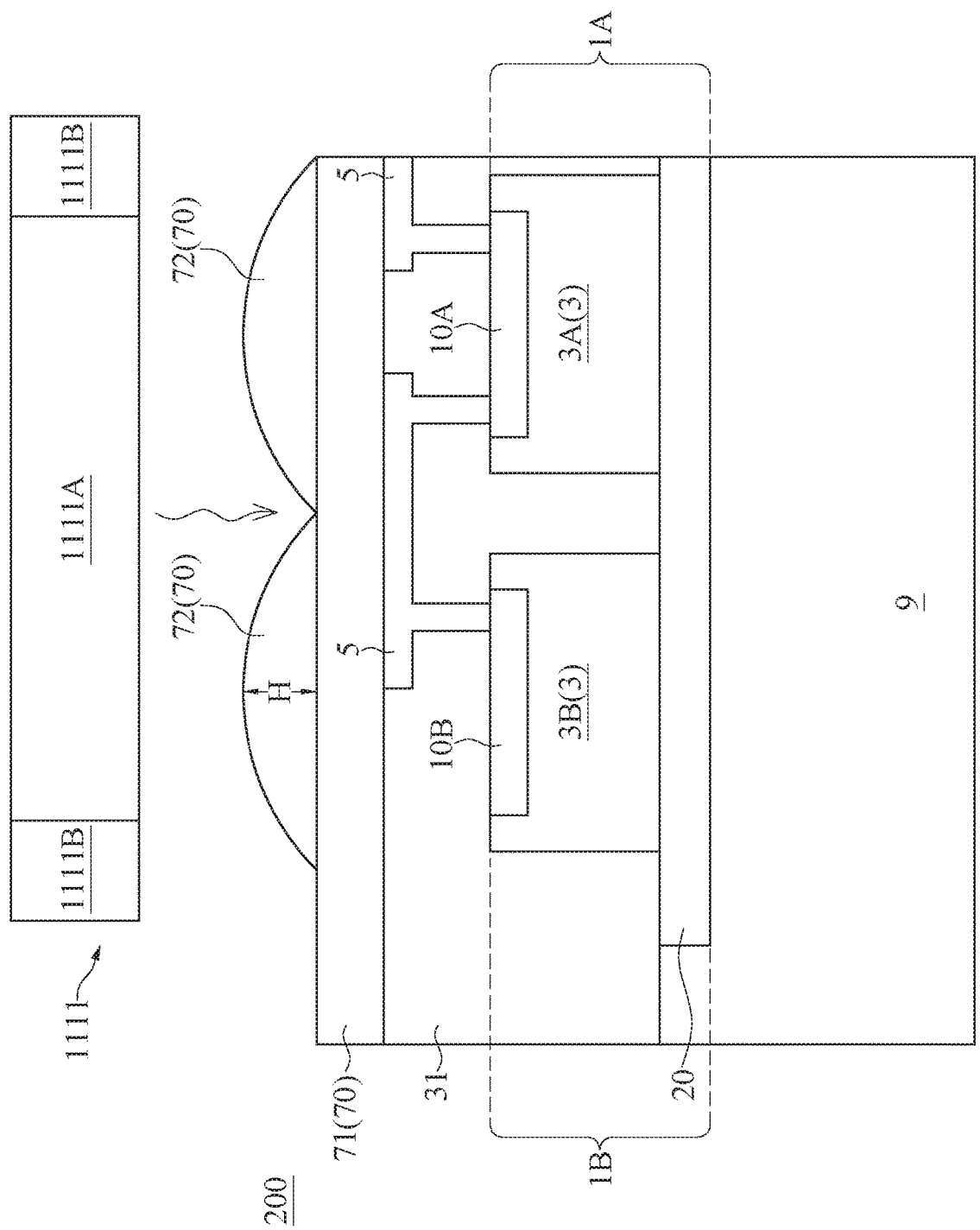
FIG. 2A illustrates a cross section of a photodetecting device, according to some embodiments of the present disclosure.
Figure 2B:
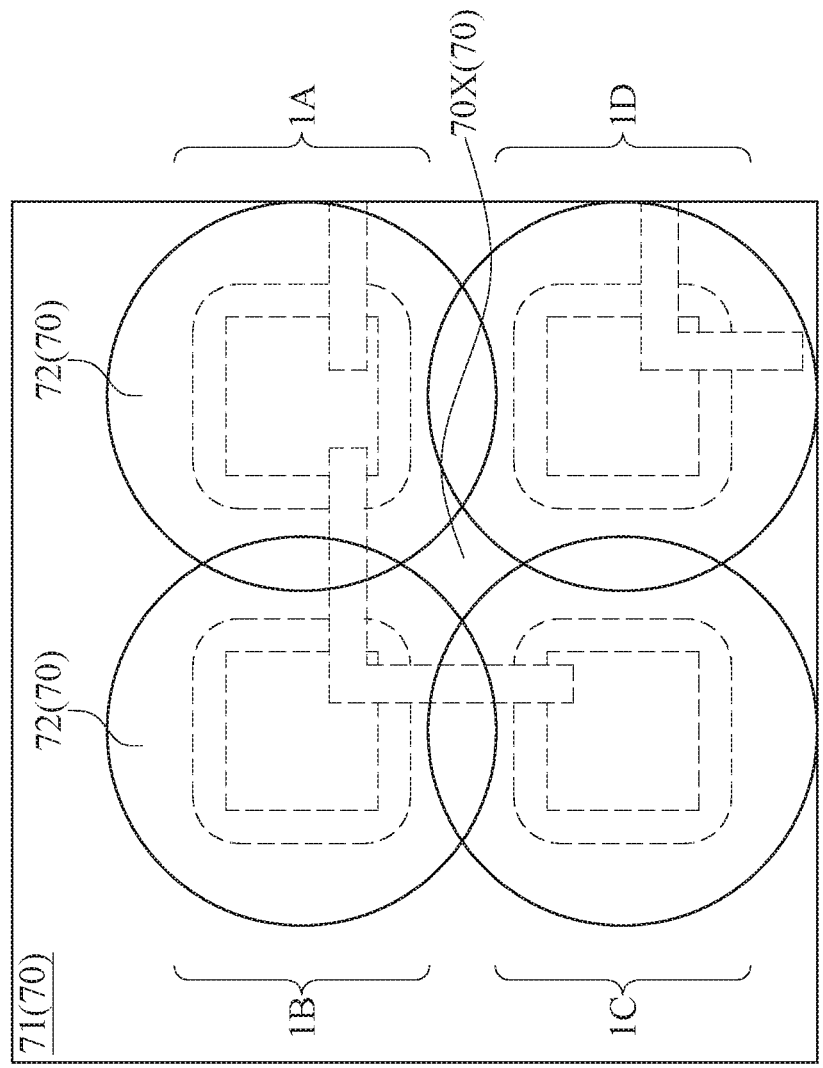
FIG. 2B illustrates a top view of a photodetecting device, according to some embodiments of the present disclosure.

Referring to FIG. 2A and FIG. 2B, FIG. 2A illustrates a cross section of a photodetecting device 200, FIG. 2B illustrates a top view of a photodetecting device 200 illustrated in FIG. 2A, according to some embodiments of the present disclosure. By incorporating an optical element 70 over the photo sensing area 3, the photodetecting device having a smaller optical aperture of active region is allowed to detect optical signal incident over an area larger than itself, thereby further improving the collection efficiency of optical signal from the core 1111A of the optical fiber 1111. The photodetecting device 200 is similar to the photodetecting device 100 as discussed in FIG. 1A to FIG. 1L except for an implementation of the optical element 70. As shown in FIG. 2A, the sub-pixels 1A and 1B are surrounded and covered by the optical element 70. Specifically, the optical element 70 may include a properly designed combination of convex portion 72 and a spacer portion 71 that separates the convex portion 72 from the sub-pixels 1A and 1B by an effective focal length of the convex portion 72. In some embodiments, the convex portion 72 may be a micro lens having a diameter or a width ranging from 3 to 12 μm and a height ranging from 1 μm to 8 μm. The design of the convex portion 72 and the spacer portion 71 allow to focus the incident light onto the top surface of the photo sensing area 3. In some embodiments, the spacer portion 71 includes an insulating material substantially transparent to the incident light. For example, the spacer portion 71 may be composed of polymeric material. In some embodiments, a top surface of the spacer portion 71 is above the first doped region 10. In some embodiments, the convex portion 72 of the optical element 70 includes a plurality of lenses disposed in a one-to-one correspondence with each of the photosensitive layers 3A, 3B, 3C and 3D (for example, one lens above each of the first photosensitive layer 3A, the second photosensitive layer 3B, the third photosensitive layer 3C, and the fourth photosensitive layer 3B).

Furthermore, by reducing a size of the sub-pixels 1A and 1B, the size of the convex portion 72 is allowed to be reduced accordingly. In a comparative embodiment of a single large pixel area being coupled to an optical fiber, a giant micro-lens (GML) may be used to provide sufficient coverage of such large pixel area. Although the GML, can cover larger area (for example, 50 μm×50 μm), difficulties in fabrication may lead to lower yield and often the greater cost.

Therefore, in some embodiments provided by the present disclosure, the optical element 70 includes multiple micro-lenses. The size of each micro-lens is smaller than that of the GML, and thus can be disposed in a one-to-one correspondence with each of the photosensitive layers of the photo sensing area 3, which, in some embodiments, occupies an area of about 10 μm×10 μwhen the shape of the convex portion 72 is square. In some embodiments, each of the convex portion 72 has a diameter or a width ranging from 3 to 12 μm. The micro-lens implemented in some present embodiments has a height ranging from 1 μm to 8 μm. The difficulty of fabricating the micro-lens is lower and the production cost is lower comparing to the fabrication of the GML. In some embodiments, adjacent micro-lenses can be connected in a continuous manner, in other words, can be physically connected to each other, for further improving the flexibility of microlens layout design. In the embodiment of four convex portion 72 having four micro-lenses connected together as shown in FIG. 2B, although a gap 70X is formed between each of the micro-lenses, the area of the gap 70X can be reduced, for example, to 10% or less of the square of the pitch P in the photodetecting device 200, by proper microlens layout design, in order to achieve an optical fill factor of about 90%. In some embodiments, the first doped portions 10A, 10B of the photosensitive layers 3A, 3B are arranged to offset from a projection area of the gap 70X respectively to decrease the coupling loss between the optical fiber 1111 and the photodetecting device 200.

In some embodiments, the implementation of the convex portions 72 in a manner of micro-lens array increases the tolerance regarding the translational or rotational misalignment between the optical fiber 1111 and the underlying photodetecting device 200, as opposed to using a GML. Specifically, even when a center of a light source, such as the optical fiber 1111, is misaligned to a center of the photodetecting device 200 by, for example, misaligned by a distance of a width WAP of a sub-pixel 1A or 1B, a great portion of optical signal may still be absorbed by the photo sensing area 3 by implementing the micro-lens array. However, the collection efficiency can be dramatically decreased under the aforesaid misalignment condition when a GML is implemented. Utilizing micro-lens array including multiple micro-lenses in a one-to-one correspondence with each of the photosensitive layers can be a more robust solution to assembling, packaging, or mechanical error that lead to serious light coupling loss.

It should be noted that the photodetecting device 100 discussed in FIG. 1A to FIG. 1L and photodetecting device 200 discussed in FIG. 2A and FIG. 2B are not limited to a front-side illumination configuration. Alternatively, a back-side illumination configuration can be implemented by people having ordinary skill in the art. For example, the optical element 70 may be disposed at the backside of the substrate 9, and configured to receive optical signal. The backside of the substrate 9 can be the surface distal from the second doped region 20. The incident optical signal is focused by the optical element 70, propagates to the front side of the substrate 9, and be absorbed by the photo sensing area 3 disposed at the front side of the substrate 9.

In some embodiments, photodetecting devices discussed in FIG. 3A to FIG. 6B alleviate the coupling loss between optical fiber and photodetecting devices.

Figure 3A:
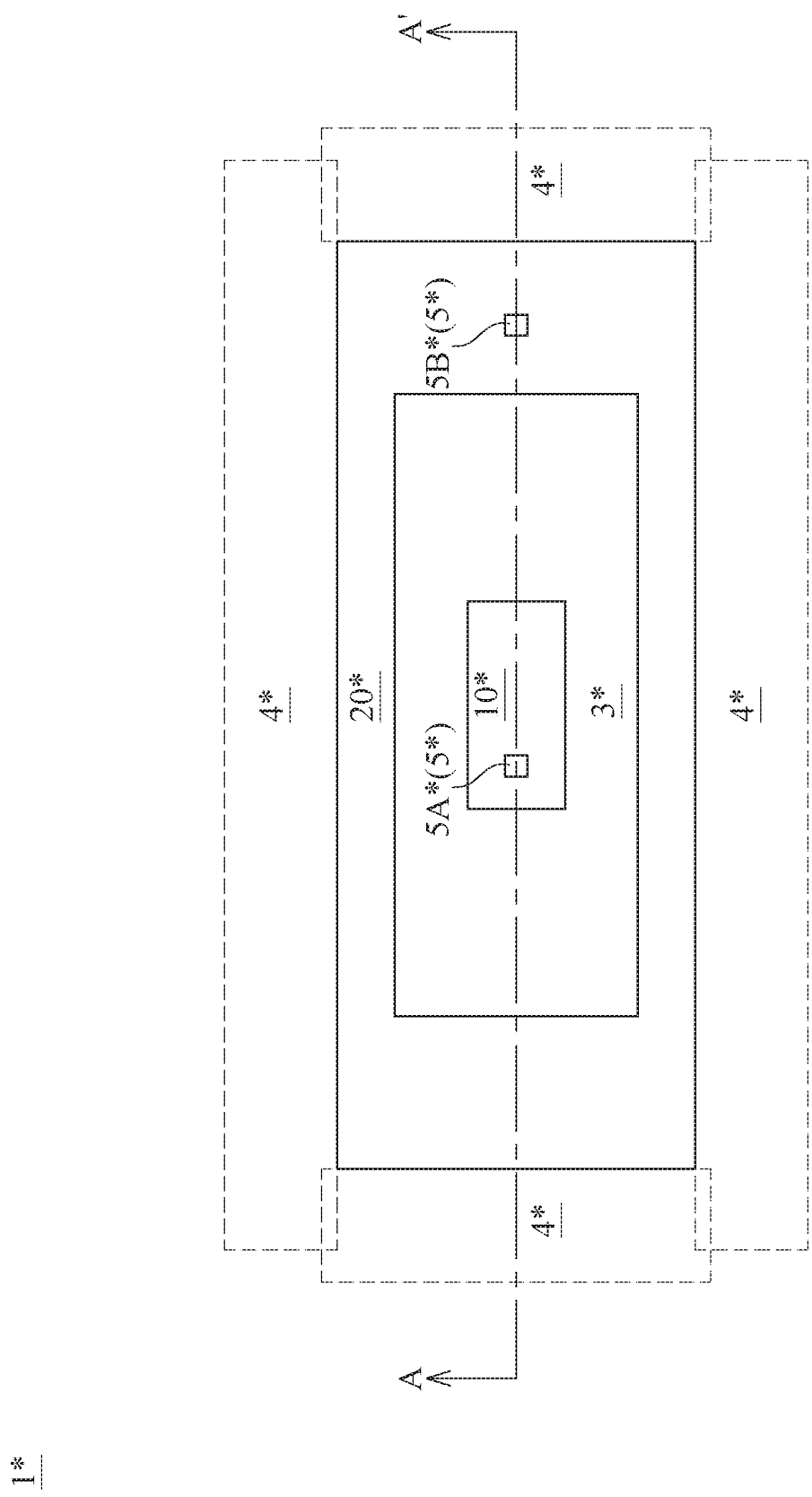
FIG. 3A illustrates a top view of a photodetecting device, according to some embodiments of the present disclosure.
Figure 3B:
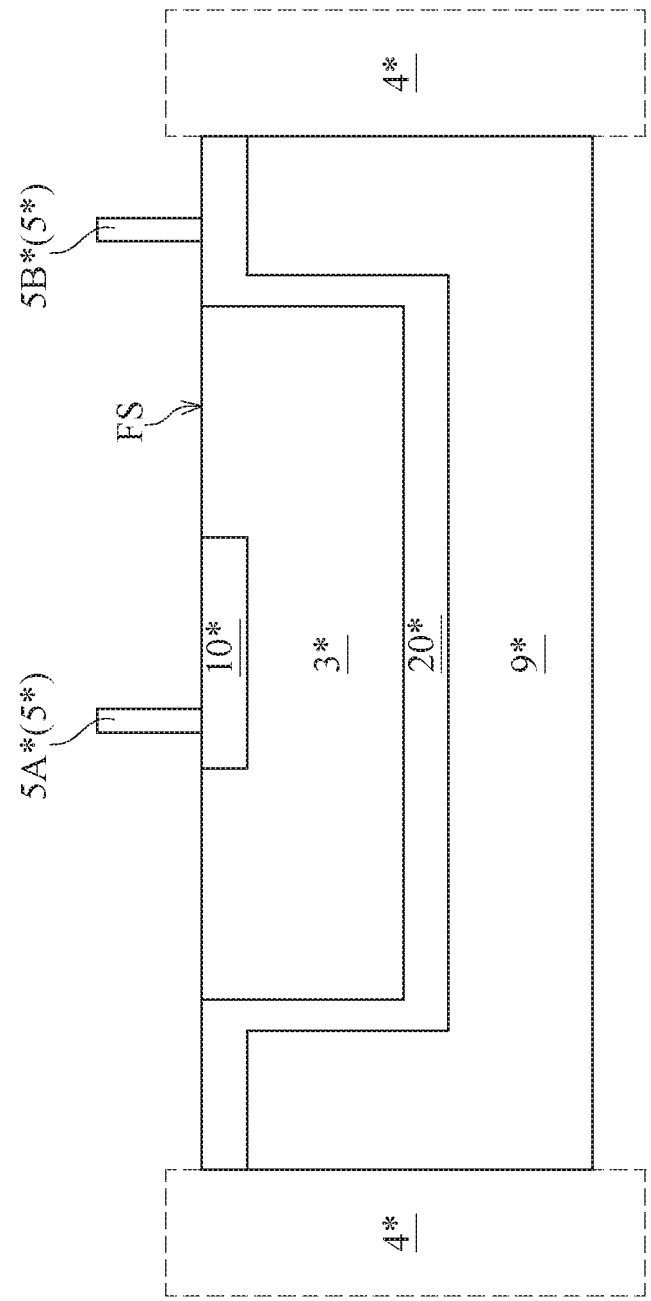
FIG. 3B illustrates a cross section of FIG. 3A along line A-A', according to some embodiments of the present disclosure.

Referring to FIG. 3A and FIG. 3B, FIG. 3A illustrates a top view of a photodetecting device, FIG. 3B illustrates a cross section of FIG. 3A along line A-A', according to some embodiments of the present disclosure. A sub-pixel 1* at least include a photosensitive layer 3* supported by a substrate 9*, a first doped portion 10* having a first conductivity type and coupled to the photosensitive layer 3*, and a second doped region 20* having a second conductivity type different from the first conductivity type and coupled to the photosensitive layer 3*. The first doped portion 10* is separated from the second doped region 20* by the photosensitive layer 3*. In some embodiments, the first doped portion 10*, the photosensitive layer 3*, and the second doped region 20* may form a p-i-n structure. In some embodiments, the photosensitive layer 3* of the sub-pixel 1* is surrounded by an isolation region 4*. In some embodiments, a top surface FS of the photosensitive layer 3*, a top surface of the first doped portion 10* and a top surface of the second doped region 20* are exposed at a same side of the substrate 9*. In some embodiments, the photosensitive layer 3* is fully embedded in the substrate 9*. In some embodiments, the photosensitive layer 3* is partially embedded in the substrate 9*.

As shown in FIG. 3A and FIG. 3B, the first doped portion 10* is at the top surface FS of the photosensitive layer 3* and laterally surrounded by the photosensitive layer 3*. The specific layout of the first doped portion 10* includes suitable depth or shape of the doping profile, such as between $1\times10^{18}$ cm$^{-3}$ to $5\times10^{21}$ cm$^{-3}$, and may be varied depending on different design, manufacturing process, or testing considerations. A portion of the second doped region 20* is between the photosensitive layer 3* and the substrate 9*, that is, a portion of the second doped region 20* laterally surrounds the photosensitive layer 3* and a portion of the second doped region 20* may be directly under the photosensitive layer 3*. In some embodiments, the second doped region 20* further includes an extended portion beneath the top surface of the substrate 9* and laterally surrounds the photosensitive layer 3* and the first doped portion 10*. The specific layout of the second doped region 20* includes suitable depth or shape of the doping profile, such as between $1\times10^{18}$ cm$^{-3}$ to $5\times10^{21}$ cm$^{-3}$, and may be varied depending on different design, manufacturing process, or testing considerations. The second doped region 20* may be surrounded by or in contact with the isolation region 4*.

Figure 4A:
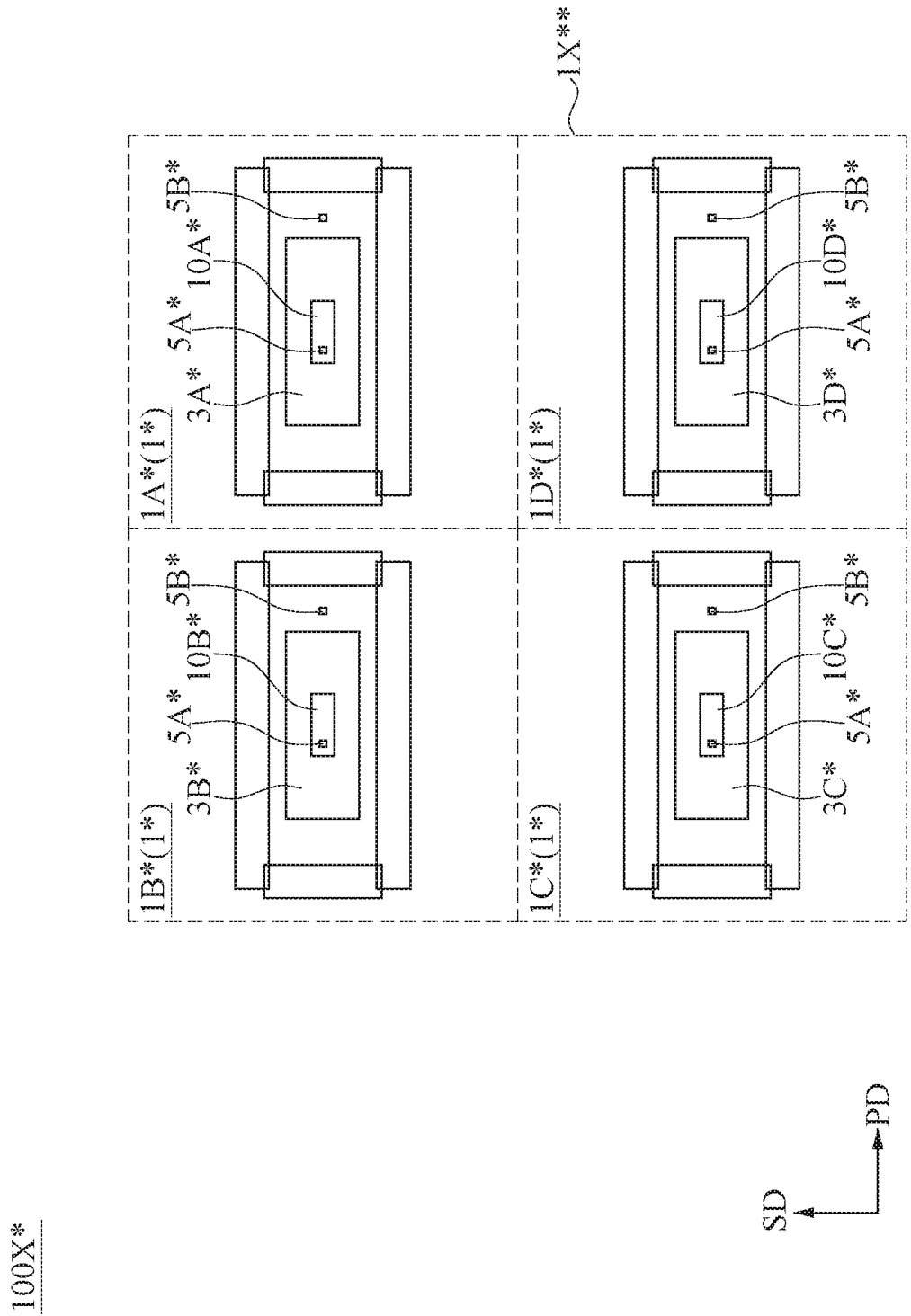
FIG. 4A illustrates a top view of an array of photodetecting devices, according to some embodiments of the present disclosure.

Referring to FIG. 3A, FIG. 3B and FIG. 4A, FIG. 4A illustrates a top view of a photodetecting device, according to some embodiments of the present disclosure. In some embodiments, in order to improve the collection efficiency of an optical signal and alleviate coupling loss, a plurality of sub-pixels 1* are binned to constitute a pixel 1X** for receiving optical signal from, for example, but not limited to, a single optical fiber. In some embodiment, the optical signal comes from a free space in applications such as 2D and 3D image sensing, in which optical fibers are not needed. Similar to the discussion in FIG. 1A to FIG. 2B, binned sub-pixels 1* break down a large sensing area into several small effective sensing areas so that the multiple micro-lenses of a micro-lens array can be disposed in a one-to-one correspondence with each of the sub-pixel 1*.

A pixel 1X** of the photodetecting device 100X* can be configured to couple to one single optical fiber, and may include more than one sub-pixels 1*. In the examples provided in FIG. 4A, four sub-pixels 1* (respectively denoted as a first sub-pixel 1A*, a second sub-pixel 1B*, a third sub-pixel 1C*, and a fourth sub-pixel 1D are shown. It should be noted that the number of sub-pixels 1* constituting a pixel 1X** of the photodetecting device 100X* is not limited to four, and can be any other number greater than 1, such as 2, 9, 16, 25, 100.

In some embodiments, the first sub-pixel 1A* has a first side along a primary axis PD and a second side along a secondary axis SD. The first side has a first length greater than a second length of the second side. The second sub-pixel 1B* has a third side along the primary axis PD and a fourth side along the secondary axis SD, wherein the third side of the second sub-pixel 1 has a third length greater than a fourth length of the fourth side of second b-pixel 1B*. In some embodiments, the primary axis PD can be substantially orthogonal to the secondary axis SD. In the embodiment shown in FIG. 4A, each of the third sub-pixel 1C* and the fourth sub-pixel 11)* of the pixel 1X** of the photodetecting device 100X* has a longer side along the primary axis PD and a shorter side along the secondary axis SD. In some embodiments, if the pixel IX** of the photodetecting device 100X* includes more than four sub-pixels 1*, each of the sub-pixels 1* may have a longer side along the primary axis PD and a shorter side along the secondary axis SD.

Referring to FIG. 4A, from a top view perspective, a collective area of the photosensitive layer 3A*, 3B*, 3C*, 3D* is smaller than an area of the pixel 1X**. In some embodiments, a pitch measured between a center of a sub-pixel 1* and a center of an adjacent sub-pixel 1* is about 10 µm, and a side of the photosensitive layer 3* of a sub-pixel 1* is in a range of from about 1.5 µm to about 8.5 µm. As previously discussed in FIG. 2A and FIG. 2B, such size is more suitable for aligning multiple micro-lens to the photosensitive layers 3* of each of the sub-pixel 1* in a one-to-one correspondence manner.

A routing layer 5* is disposed above the substrate 9*, electrically coupling the first doped portion 10* and the second doped region 20*. The routing layer 5* includes a first end 5A* configured to connect a plurality of the first doped portions 10* of the plurality of the sub-pixels 1*, and a second end 5B* configured to connect a plurality of the second doped regions 20* of the plurality of the sub-pixels 1*. In some embodiments, the first end 5A* and the second end 5B* are respectively connected to different bias. In some embodiments, the routing layer 5* is further connected to a complementary metal-oxide-semiconductor (CMOS) circuit on another substrate. In some embodiments, the sub-pixels 1* of a photodetecting device 100X* illustrated in FIG. 3B possesses a backside illumination configuration where the incident light is received at a backside of the substrate 9*. Similar to the embodiments previously described in FIG. 2A and FIG. 2B, optical elements including a micro-lens array and a spacer portion can be disposed at the backside of the substrate 9* under the backside illumination configuration.

Figure 4B:
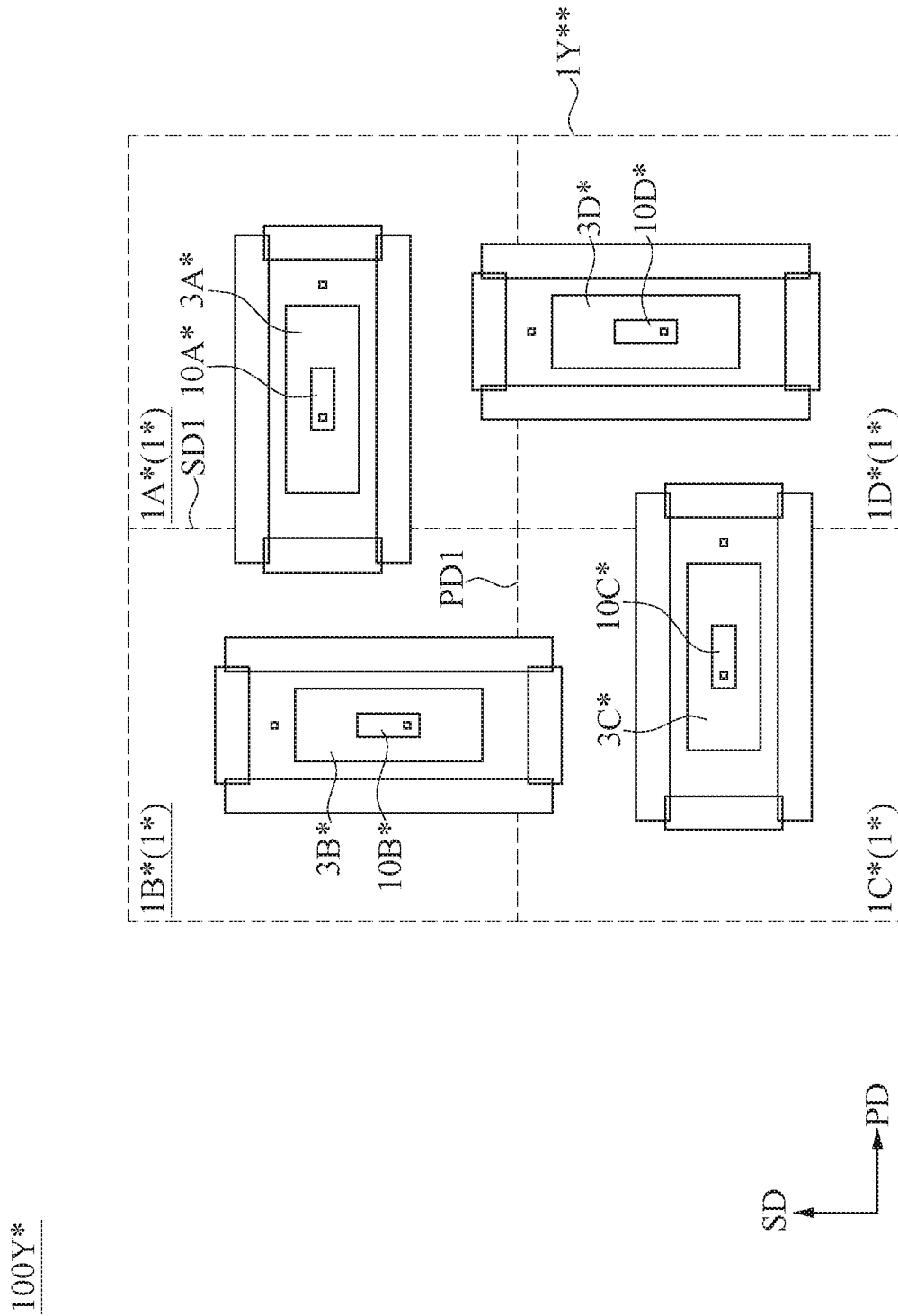
FIG. 4B illustrates a top view of an array of photodetecting devices, according to some embodiments of the present disclosure.

Referring to FIG. 3A, FIG. 3B and FIG. 4B, FIG. 4B illustrates a top view of a photodetecting device 100Y*, according to some embodiments of the present disclosure. A pixel 1Y** of the photodetecting device 100Y* is similar to the pixel 1X** of the photodetecting device 100X*, except for the arrangement of the sub-pixels 1* is different. In the examples provided in FIG. 4B, four sub-pixels 1* (respectively denoted as a first sub-pixel 1A*, a second sub-pixel 1B*, a third sub-pixel 1C* adjacent to the first sub-pixel 1A* in the same orientation, and a fourth sub-pixel 1D* adjacent to the second sub-pixel 1B* in the same orientation) are shown.

The first sub-pixel 1A* has a first side along a primary axis PD and a second side along a secondary axis SD. The first side has a first length greater than a second length of the second side. The second sub-pixel 1B* has a third side along the secondary axis SD and a fourth side along the primary axis PD, wherein the third side of the second sub-pixel 1B* has a third length greater than a fourth length of the fourth side of the second sub-pixel 1B*. In some embodiments, the third sub-pixel 1C* has a first side along a primary axis PD and a second side along a secondary axis SD. The first side of the third sub-pixel 1C* has a first length greater than a second length of the second side of the third sub-pixel 1C*. The fourth sub-pixel 1D* has a first side along the secondary axis SD and the second side along the primary axis PD. The first side of the fourth sub-pixel 1D* has a first length greater than a second length of the second side of the fourth sub-pixel 1D*. In some embodiments, the primary axis PD can be substantially orthogonal to the secondary axis SD. It should be noted that the number of sub-pixels 1* constituting a pixel 1Y** of the photodetecting device 100Y* is not limited to four, and can be any other number greater than 1, such as 2, 9, 16, 25, 100.

By implementing the arrangement in FIG. 4B, the area density of the photosensitive layers 3A*, 3B*, 3C*, 3D* per pixel 1Y** can be increased compared to the arrangement in FIG. 4A. In some embodiments, the first sub-pixel 1A*, the second sub-pixel 1B*, the third sub-pixel 1C*, and the fourth sub-pixel 1D* are symmetric with regard to a center of the pixel 1Y**. In some embodiments, at least one of the first sub-pixel 1A*, the second sub-pixel 1B*, the third sub-pixel 1C*, and the fourth sub-pixel 1D* extends across a middle plane PD1 along the primary axis PD, the middle plane SD1 along the secondary axis SD, or both, in order to achieve a denser sub-pixels 1* layout. It should be noted that, if the pixel 1Y** includes more than four sub-pixels 1*, each of the sub-pixels 1* can be arranged in a similar manner.

Figure 5A:
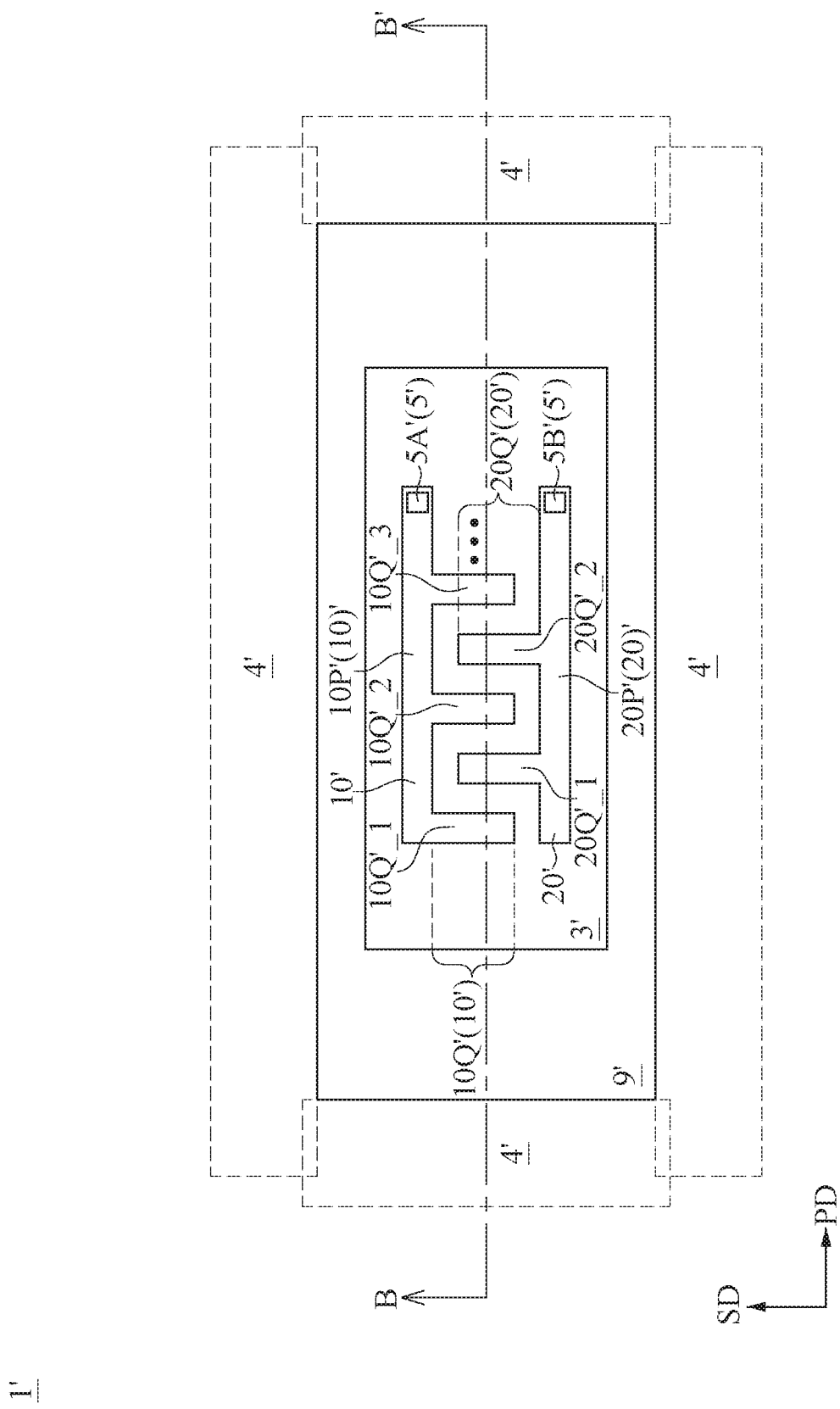
FIG. 5A illustrates a top view of a photodetecting device, according to some embodiments of the present disclosure.
Figure 5B:
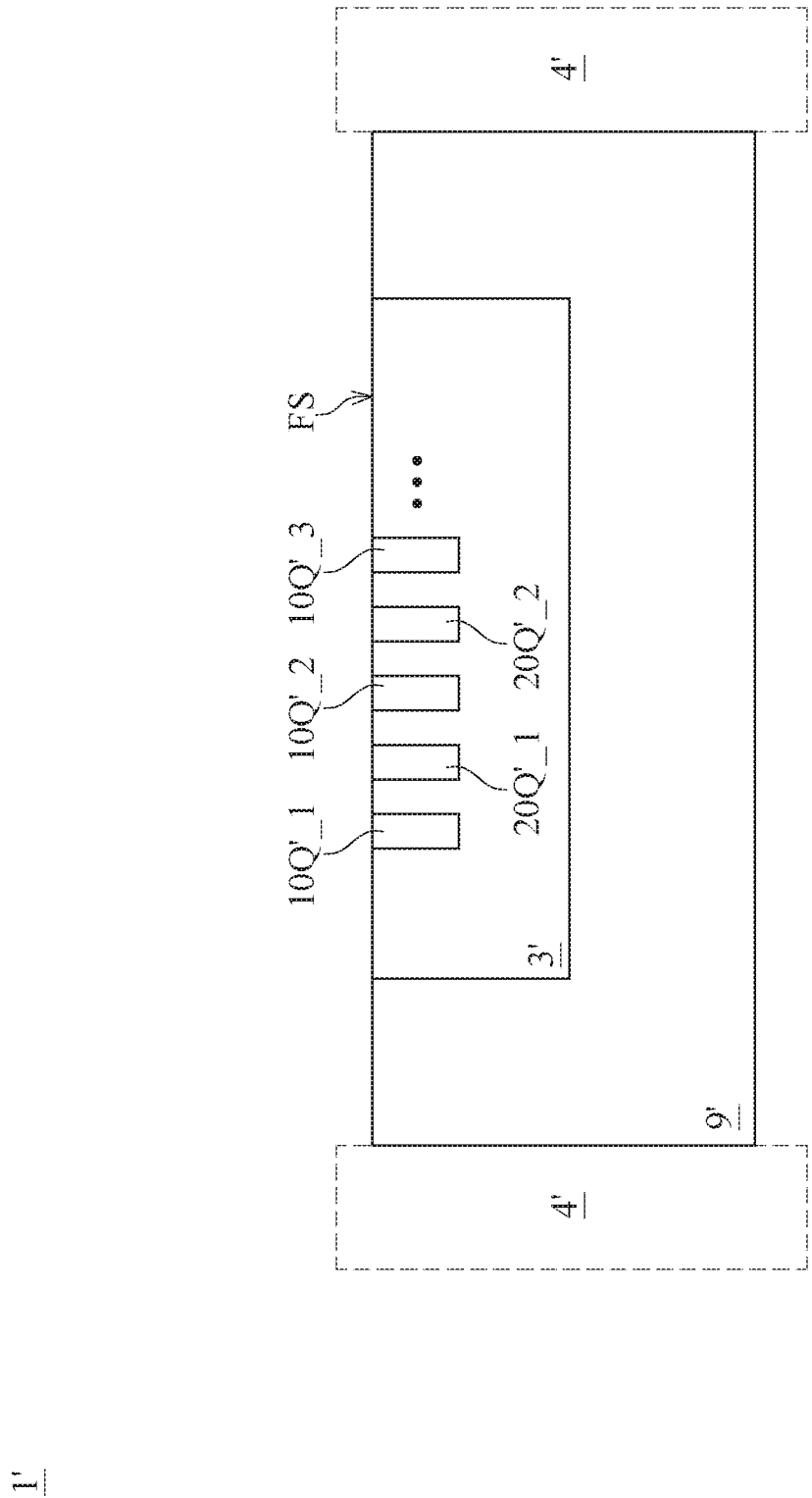
FIG. 5B illustrates a cross section of FIG. 5A along line B-B', according to some embodiments of the present disclosure.

Referring to FIG. 5A and FIG. 5B, FIG. 5A illustrates a top view of a photodetecting device, FIG. 5B illustrates a cross section of FIG. 5A along line B-B', according to some embodiments of the present disclosure. Another type of sub-pixel 1' is provided in FIG. 5A and FIG. 5B. The sub-pixel 1' at least includes a photosensitive layer 3' over a substrate 9', a first doped portion 10' having a first conductivity type and coupled to the photosensitive layer 3', and a second doped region 20' having a second conductivity type different from the first conductivity type and coupled to the photosensitive layer 3'. The first doped portion 10' is separated from the second doped region 20' by the photosensitive layer 3'. In some embodiments, the first doped portion 10', the photosensitive layer 3', and the second doped region 20' may form a p-i-n structure. In some embodiments, the photosensitive layer 3' is exposed from the substrate 9' and laterally surrounded by the substrate 9'. In some embodiments, the photosensitive layer 3', the first doped portion 10' and the second doped region 20' are laterally surrounded by an isolation region 4'. The substrate 9' is laterally surrounded by the isolation region 4'. The specific layout of the first doped portion 10' and the second doped region 20' includes suitable depth or shape of the doping profile, such as between $1 \times 10^{18}$ cm$^{-3}$ to $5 \times 10^{21}$ cm$^{-3}$, and may be varied depending on different design, manufacturing process, or testing considerations.

As shown in FIG. 5A and FIG. 5B, both of the first doped portion 10' and the second doped region 20' are disposed proximal to a top surface FS of the photosensitive layer 3'. In some embodiments, the first doped portion 10' includes a first portion 10P' extending along a primary axis PD, and the second doped region 20' includes a first portion 20P' extending along the primary axis PD. The first doped portion 10' further includes a second portion 10Q' extending toward the second doped region 20', and the second doped region 20' further includes a second portion 20Q' extending toward the first doped portion 10'. In some embodiments, the second portion 10Q' of the first doped portion 10' and the second portion 20Q' of the second doped region 20' extends substantially along a secondary axis SD. In some embodiments, the primary axis PD is along a first side of a sub-pixel 1', and the secondary axis SD is along a second side of the sub-pixel 1', wherein the second side is shorter than the first side. In some embodiments, the secondary axis SD may be substantially orthogonal to the primary axis PD. In some implementation, the first portion 10P' and/or the first portion 20P' may be optional.

In some embodiments, the first doped portion 10' is interlaced with the second doped region 20' from a top view perspective. In some embodiments, the second portion 10Q' of the first doped portion 10' includes one or more extension portions (denoted as 10Q'_1, 10Q'_2, 10Q'_3 . . . ) extending toward the second doped region 20'. The second portion 20Q' of the second doped region 20' includes one or more extension portions (denoted as 20Q'_1, 20Q'_2 . . . ) extending toward the first doped portion 10'. The extension portions of the first doped portion 10' and the extension portions of the second doped region 20' are arranged alternatively along the primary axis PD in a staggered fashion, that is, one extension portion of the second doped region 20' is between two extension portions of the first doped portion 10' and vice versa. Each of the extension portions of the first doped portion 10' and the extension portions of the second doped region 20' are separated by a portion of the photosensitive layer 3'.

Referring to FIG. 6A, FIG. 6A illustrates a top view of a photodetecting device 100X', according to some embodiments of the present disclosure. The arrangement of sub-pixels 1' can be similar to the arrangement of sub-pixels 1* as discussed in FIG. 4A. In the examples provided in FIG. 6A, four sub-pixels (respectively denoted as a first sub-pixel 1A', a second sub-pixel 1B', a third sub-pixel 1C', and a fourth sub-pixel 10') are shown. It should be noted that the number of sub-pixels 1' constituting a pixel 1X" of the photodetecting device 100X' is not limited to four and can be any other number greater than 1, such as 2, 9, 16, 25, 100.

In some embodiments, the first sub-pixel 1A' has a first side along a primary axis PD and a second side along a secondary axis SD. The first side of the first sub-pixel 1A' has a first length greater than a second length of the second side of the first sub-pixel 1A'. The second sub-pixel 1B' has a first side along the primary axis PD and the second side along the secondary axis SD. The first side of the second sub-pixel 1B' has a first length greater than a second length of the second side of the second sub-pixel 1B'. In some embodiments, the primary axis PD can be substantially orthogonal to the secondary axis SD. In the embodiment shown in FIG. 6A, each of the third sub-pixel 1C' and the fourth sub-pixel 1D' of the photodetecting device 100X' has a longer side along the primary axis PD and a shorter side along the secondary axis SD. In some embodiments, if the pixel 1X" of the photodetecting device 100X' includes more than four sub-pixels 1', each of the sub-pixels 1' may have a longer side along the primary axis PD and a shorter side along the secondary axis SD, in some embodiments, one pixel 1X" of the photodetecting device 100X' may be configured to receive optical signal from a single optical fiber, as previously described in FIG. 1A and FIG. 2A.

In some embodiments, in order to improve the optical signal collection efficiency and alleviate coupling loss, a plurality of sub-pixels 1' in photodetecting device 100X' are binned to constitute a pixel IX" for receiving optical signal from, for example, but not limited to, a single optical fiber. In some embodiment, the optical signal comes from a free n applications such as 2D and 3D image sensing, in which optical fibers are not needed. Similar to the discussion in FIG. 1A, FIG. 2B, and FIG. 4A, binned sub-pixels 1' break down a large sensing area into several small effective sensing areas so that multiple micro-lenses of a micro-lens array can be disposed in a one-to-one correspondence with each of the sub-pixel 1'.

Referring to FIG. 6A, from a top view perspective, a collective area of the photosensitive layers 3A', 3B', 3C', 3D' is smaller than an area of the pixel 1X". In some embodiments, a pitch measured between a center of a sub-pixel 1' and a center of an adjacent sub-pixel 1' is about 10 μm, and a side of the photosensitive layer 3' of a sub-pixel 1' is in a range of from about 1.5 μm, to about 8.5 μm. As previously discussed in FIG. 2A and FIG. 2B, such size is more suitable for aligning multiple micro-lenses to the photosensitive layers 3' of each of the sub-pixel 1' in a one-to-one correspondence manner.

Figure 6B:
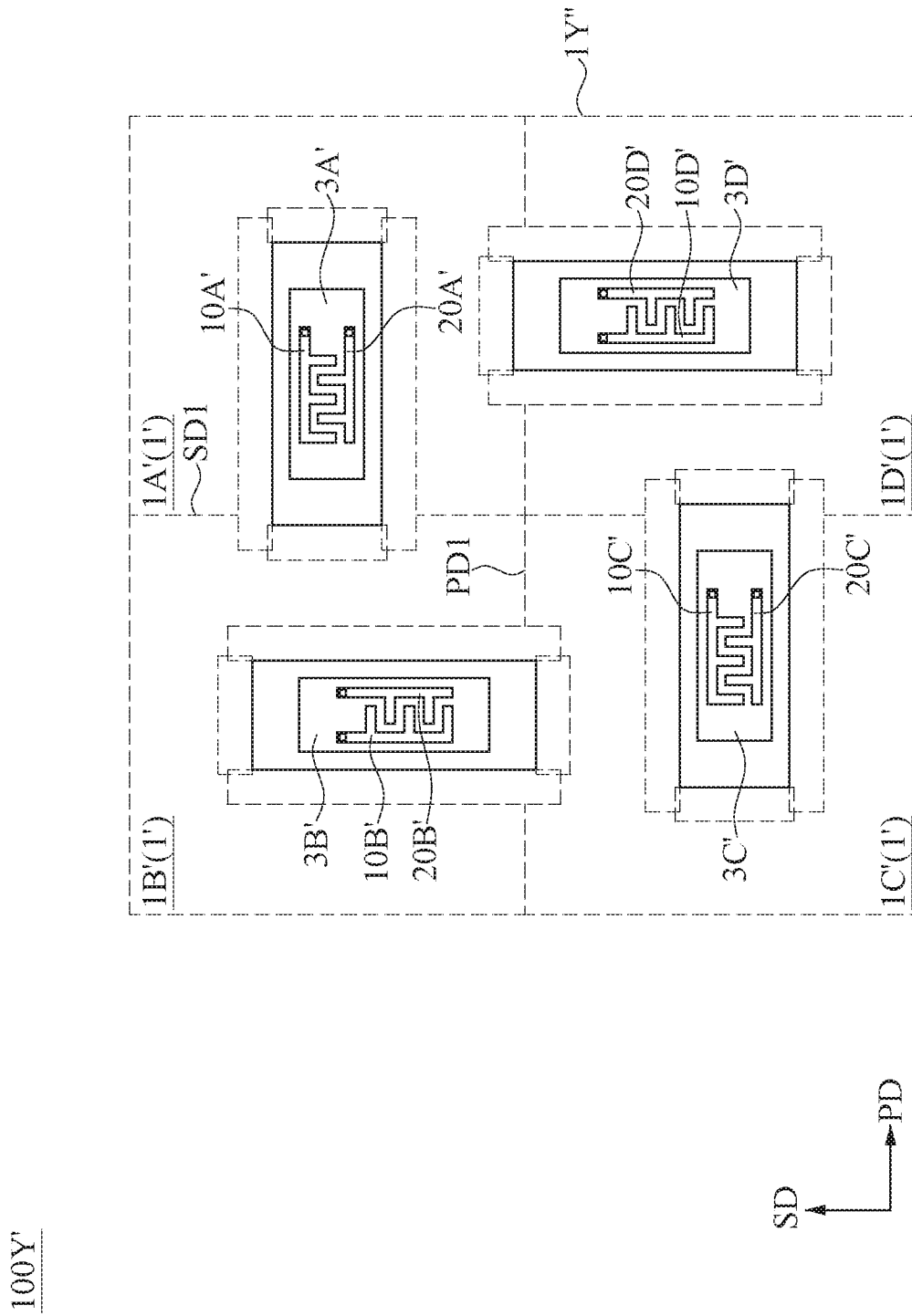
FIG. 6B illustrates a top view of an array of photodetecting devices, according to some embodiments of the present disclosure.

Referring to FIG. 6B, FIG. 6B illustrates a top view of a photodetecting device, according to some embodiments of the present disclosure. The arrangement of the pixel 1Y''' of the photodetecting device 100Y' is similar to the pixel 1Y** of the photodetecting device 100Y*. In the examples provided in FIG. 6B, four sub-pixels 1' (respectively denoted as the first sub-pixel 1A', a second sub-pixel 1B', a third sub-pixel 1C', and a fourth sub-pixel 1D') are shown. The first sub-pixel 1A' has a first side along a primary axis PD and a second side along a secondary axis SD. The first side of the first sub-pixel 1A' has a first length greater than a second length of the second side of the first sub-pixel 1A'. The second sub-pixel 1B' has a first side along the secondary axis SD and a second side along the primary axis PD. The first side of the second sub-pixel 1B' has a first length greater than a second length of the second side second sub-pixel 1B'. In some embodiments, the third sub-pixel 1C' has a first side along a primary axis PD and a second side along a secondary axis SD. The first side of the third sub-pixel 1C' has a first length greater than a second length of the second side of the third sub-pixel 1C. The fourth sub-pixel 1D' has a first side along the secondary axis SD and the second side along the primary axis PD. The first side of the fourth sub-pixel 1D' has a first length greater than a second length of the second side of the fourth sub-pixel 1D'. In some embodiments, the primary axis PD can be substantially orthogonal to the secondary axis SD. It should be noted that the number of sub-pixels 1' constituting a pixel 1Y''' of the photodetecting device 100Y' is not limited and can be any other number greater than 1, such as 2, 9, 16, 25, 100.

By implementing the arrangement in FIG. 6B, the area density of the photosensitive layers 3A', 3B', 3C', 3D' per pixel 1Y''' can be increased compared to the arrangement in FIG. 6A. In some embodiments, the first sub-pixel 1A', the second sub-pixel 1B', the third sub-pixel 1C', and the fourth sub-pixel 1D' are symmetric with regard to a center of the pixel 1Y'''. In some embodiments, at least one of the first sub-pixel 1A', the second sub-pixel 1B', the third sub-pixel 1C', and the fourth sub-pixel 1D' extends across a middle plane PD1 along the primary axis PD, the middle plane SD1 along the secondary axis SD, or both, in order to achieve a denser sub-pixels 1' layout. It should be noted that, if the pixel 1Y''' includes more than four sub-pixels 1', each of the sub-pixels 1' can be arranged in a similar manner.

Referring to FIG. 5A to FIG. 6B, a routing layer 5' is disposed above the substrate 9' in a similar fashion as illustrated in FIG. 3B. The routing layer 5' includes a first end 5A' configured to connect a plurality of the first doped portions 10' in the plurality of the sub-pixels 1', and a second end 5B' configured to connect a plurality of the second doped regions 20' of the plurality of the sub-pixels 1'. In some embodiments, the first end 5A' and the second end 5B' are respectively connected to different bias. In some embodiments, the routing layer 5' is further connected to a complementary metal-oxide-semiconductor (CMOS) circuit on another substrate. In some embodiments, the sub-pixels 1' of a photodetecting device 100Y* illustrated in FIG. 5B possesses a backside illumination configuration where the incident light is received at a backside of the substrate 9'. Similar to the embodiments previously described in FIG. 2A and FIG. 2B, optical elements including a micro-lens array and a spacer portion can be disposed at the backside of the substrate 9' under the backside illumination configuration. In some implementations, when the first portion 10P' and/or the first portion 20P' are absent, there may be multiple first ends 5A' connected to the second portions 10Q' instead of the first portion 10P', and there may be multiple second ends 5B' connected to the second portions 20Q' instead of the first portion 20P'.

Besides total area of the photosensitive area, it is also important to improve the collection efficiency of incident optical signal and alleviate coupling loss. Therefore, each pixels 1X, 1Y, 1X''', or 1Y''' for receiving optical signal from a single optical fiber disclosed in the present embodiment includes more than one sub-pixels and arranged in binned fashion to compensate the optical signal loss due to decreased size of photosensitive area. Convex portion of optical element such as a micro-lens or a micro-lens array can be disposed above each of the sub-pixels in a one-to-one corresponding manner, thus alleviating coupling loss. It should also be noted that the photosensitive layer of each sub-pixels is designed to fit the size of an easier-to-fabricate micro-lens or micro-lens array.

The materials of substrate 9* or 9' are similar to the substrate 9 and the material of the photo sensing area 3' or 3* may be similar to the material of the photo sensing area 3 in FIG. 1A to FIG. 1L. It should be noted that the structures of photodetecting devices and the methods discussed in the present disclosure is suitable when the substrate 9, 9* or 9' includes silicon and the photo sensing area 3, 3', or 3* includes germanium or germanium-silicon.

In some embodiments, the photodetecting devices 100, 200, 100X*, 100Y*, 100X' and 100Y' and the methods discussed in the present disclosure can be applied to optical communication device, optical sensors, optical receivers, optical actuators, or light detection and ranging (LIDAR) applications. Among which, dark current reduction is especially critical to LIDAR application.

The dark current of the photodetecting devices 100, 200, 100X*, 100Y*, 100X' and 100Y' can be reduced by the implementation of micro-lens or micro-lens arrays. Generally speaking, the magnitude of dark current is inversely related to a total area of the optical aperture or the active region. For example, by breaking down a 100 μm×100 μm single large pixel into a 10×10 sub-pixel array (i.e., each sub-pixel having a dimension of about 10 μm×10 μm), and implementing a 10×10 micro-lens array to the 10×10 sub-pixel array in a one-to-one corresponding manner in order to focus the incident light to an optical aperture or active region of about 2.5 μm×2.5 μm in each sub-pixels, the dark current can be effectively reduced by 16 times (i.e., $(10/2.5)^2$).

For another example, by breaking down a 100 pin×100 μm single large pixel into a 2×2 sub-pixel array (i.e., each sub-pixel having a dimension of about 50 μm×50 μm), and implementing a 2×2 GML array to the 2×2 sub-pixel array in a one-to-one corresponding manner in order to focus the incident light to an optical aperture or active region of about 2.5 μm×2.5 pin in each sub-pixels, the dark current can be effectively reduced by 400 times (i.e., $(50/2.5)^2$). In some embodiments where a GML array is implemented, dark current of the of the photodetecting devices 100, 200, 100X*, 100Y*, 100X' and 100Y' can be decreased to an extent lower than implementing the micro-lens array in the 10×10 sub-pixel array, as previously discussed. However, the fabrication process of GML or GML array is difficult and often requires higher cost than that of micro-lens or micro-lens array.

In the embodiments where micro-lens or micro-lens array is implemented, further dark current reduction, for example, by an order of magnitude, can be achieved by operating the photodetecting devices 100, 200, 100X*, 100Y*, 100X' and 100Y' at a low reverse bias. For the binned sub-pixel configuration disclosed in the present disclosure, manufacturing processes, including but not limited to, bumping, read-out integrated circuit, wire-bonding and boarding, may introduce variation to electrical circuitry of the photodetecting devices. Furthermore, the variation may also present at the input referred voltage to each amplifier (e.g., in a TIA circuit) of each photodetecting devices. To eliminate the aforesaid process variation which may lead to generation of dark current (e.g., operating under a forward-bias regime), the voltage drop across each photodetecting device can be controlled in a sufficient negative number so as to keep the photodetecting device under a low-reverse regime.

For the LIDAR application, sensitivity of the photodetecting device can be affected by various factors in addition to dark current. Three of the major noise sources with regard to a photodetecting device can be characterized as (1) dark current noise, (2) ambient noise, and (3) current noise resulted from the transimpedance amplifier (TIA) circuit or other CMOS circuits. The sensitivity of an optical communication model can be approximated by the following formula, $$\text{Sensitivity } S = h\omega \{Q^2 * e * BW * C_1 + Q *^{(} i_{TIA}^{2)} + 2e*(I_d + I_a)*BW*C_2]^{1/2}\}/e\, \eta,$$

wherein Q stands for Q factor (or often referred to as Q value), $C_1$ and $C_2$ are constants (can be referred to as Personik constants), BW is bandwidth of the photodetector, $\eta$ stands for quantum efficiency, $h*\omega$ is the energy of photon, $i_{TIA}$ is the current of trans-impedance amplifier (TIA) circuit, $I_a$ is ambient light noise photo current, and $I_d$ is dark current.

According to empirical of an optical communication model, herein $i_{TIA}$ and $I_a$ are often within a range of hundreds of nanoamphere (nA). Therefore, as long as the dark current resulted from the present disclosure is comparable to that generated from ambient noise and TIA circuit noise, e.g., within a range of hundreds of nanoamphere, the noise of dark current may no longer be accounted as the dominant source of noise, and the sensitivity of the photodetecting device may not be deteriorated.

As used herein and not otherwise defined, the terms "substantially" and "about" are used to describe and account for small variations. When used in conjunctions with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a line or a plane can be substantially flat if a peak or depression of the line or plane is no greater than 5 μm, no greater than 1 μm, or no greater than 0.5 μm.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A photodetecting device, comprising:
   a substrate;
   a first photosensitive layer supported by the substrate;
   a second photosensitive layer supported by the substrate and adjacent to the first photosensitive layer, each of the first photosensitive layer and the second photosensitive layer being coupled to:
      a first doped portion having a first conductivity type; and
      a second doped region having a second conductivity type different from the first conductivity type;
      wherein the first photosensitive layer is separated from the second photosensitive layer, and the first doped portion coupled to the first photosensitive layer is electrically connected to the first doped portion coupled to the second photosensitive layer; and
   an optical element covering the first photosensitive layer and the second photosensitive layer, wherein the optical element comprises a spacer portion and a convex portion over the spacer portion.

2. The photodetecting device of claim 1, further comprising a routing layer connecting the first doped portion coupled to the first photosensitive layer and the first doped portion coupled to the second photosensitive layer.

3. The photodetecting device of claim 1, wherein the second doped region coupled to the first photosensitive layer and the second photosensitive layer is a continuous region.

4. The photodetecting device of claim 1, further comprising an insulation layer spacing between the first photosensitive layer and the second photosensitive layer.

5. The photodetecting device of claim 1, wherein the convex portion comprises multiple lenses disposed in a one-to-one correspondence with each of the first photosensitive layer and the second photosensitive layer.

6. The photodetecting device of claim 1, wherein a portion of the second doped region is exposed to a space separating the first photosensitive layer and the second photosensitive layer.

7. A photodetecting device, comprising:
   a substrate;
   a first photosensitive layer supported by the substrate;
   a second photosensitive layer supported by the substrate and adjacent to the first photosensitive layer, each of the first photosensitive layer and the second photosensitive layer having a top surface and a bottom surface, wherein the bottom surface is closer to the substrate than the top surface, and wherein each of the first photosensitive layer and the second photosensitive layer is coupled to:
- a first doped portion having a first conductivity type and proximal to the top surface; and
- a second doped region having a second conductivity type and proximal to the bottom surface, wherein the first photosensitive layer is separated from the second photosensitive layer; and an optical element over the first photosensitive layer and the second photosensitive layer, wherein the optical element comprises:
- a spacer portion over the substrate and over the first photosensitive layer and the second photosensitive layer; and
- a convex portion over the spacer portion.

8. The photodetecting device of claim 7, further comprising a routing layer connecting the first doped portion coupled to the first photosensitive layer and the first doped portion coupled to the second photosensitive layer.

9. The photodetecting device of claim 7, wherein a total area of the second doped region is greater than a total area of the first doped portion of the first photosensitive layer and the first doped portion of the second photosensitive layer combined.

10. The photodetecting device of claim 7, wherein a portion of the second doped region is exposed to a space separating the first photosensitive layer and the second photosensitive layer.

11. The photodetecting device of claim 7, wherein the spacer portion separates the first photosensitive layer and the convex portion and separates the second photosensitive layer and the convex portion.

12. The photodetecting device of claim 7, wherein the convex portion comprises multiple lenses disposed in a one-to-one correspondence with each of the first photosensitive layer and the second photosensitive layer, and the lenses are physically connected to each other.

13. A photodetecting device, comprising:
a first sub-pixel, comprising:
- a first photosensitive layer having a top surface and a bottom surface;
- a first doped portion having a first conductivity type and exposed from the top surface of the first photosensitive layer; and
- a second doped region having a second conductivity type and coupled to the first photosensitive layer, wherein the first doped portion is laterally surrounded by the first photosensitive layer along the top surface; and the first photosensitive layer is laterally surrounded by the second doped region along the bottom surface;
an isolation region surrounding the first sub-pixel; and
a second sub-pixel adjacent to the first sub-pixel and being separated from the first sub-pixel by the isolation region.

14. The photodetecting device of claim 13, wherein:
the first sub-pixel has a first side along a primary axis and a second side along a secondary axis, wherein the first side has a first length greater than a second length of the second side; and
the second sub-pixel has a third side along the primary axis and a fourth side along the secondary axis, wherein the third side has a third length greater than a fourth length of the fourth side.

15. The photodetecting device of claim 13, wherein:
the first sub-pixel has a first side along a primary axis and a second side along a secondary axis, wherein the first side has a first length greater than a second length of the second side; and
the second sub-pixel has a third side along the secondary axis and a fourth side along the primary axis, wherein the third side has a third length greater than a fourth length of the fourth side.

16. The photodetecting device of claim 13, wherein the second doped region is exposed from the top surface of the first photosensitive layer, and the first doped portion is interlaced with the second doped region from a top view perspective.

17. The photodetecting device of claim 13, further comprising a routing layer electrically coupling the first doped portion and the second doped region.

18. A photodetecting device, comprising:
a substrate;
a first photosensitive layer supported by the substrate;
a second photosensitive layer supported by the substrate and adjacent to the first photosensitive layer, each of the first photosensitive layer and the second photosensitive layer having a top surface and a bottom surface, wherein the bottom surface is closer to the substrate than the top surface, and wherein each of the first photosensitive layer and the second photosensitive layer is coupled to:
- a first doped portion having a first conductivity type and proximal to the top surface; and
- a second doped region having a second conductivity type and proximal to the bottom surface, wherein the first photosensitive layer is separated from the second photosensitive layer, wherein a total area of the second doped region is greater than a total area of the first doped portion of the first photosensitive layer and the first doped portion of the second photosensitive layer combined.

19. A photodetecting device, comprising:
a first sub-pixel, comprising:
- a first photosensitive layer having a top surface and a bottom surface;
- a first doped portion having a first conductivity type and exposed from the top surface of the first photosensitive layer; and
- a second doped region having a second conductivity type and coupled to the first photosensitive layer;
an isolation region surrounding the first sub-pixel; and
a second sub-pixel adjacent to the first sub-pixel and being separated from the first sub-pixel by the isolation region, wherein the second doped region is exposed from the top surface of the first photosensitive layer, and wherein the first doped portion is interlaced with the second doped region from a top view perspective.

20. A photodetecting device, comprising:
a first sub-pixel, comprising:
- a first photosensitive layer having a top surface and a bottom surface;
- a first doped portion having a first conductivity type and exposed from the top surface of the first photosensitive layer; and
- a second doped region having a second conductivity type and coupled to the first photosensitive layer;

an isolation region surrounding the first sub-pixel;
a second sub-pixel adjacent to the first sub-pixel and being separated from the first sub-pixel by the isolation region; and
an optical element covering the first photosensitive layer and the second photosensitive layer, wherein the optical element comprises a spacer portion and a convex portion over the spacer portion.

* * * * *